(12) United States Patent
Yavas et al.

(10) Patent No.: US 12,224,616 B1
(45) Date of Patent: Feb. 11, 2025

(54) SYSTEMS AND METHODS OF DYNAMIC ADAPTIVE FAST CHARGING IN BATTERIES TO REDUCE LITHIUM PLATING

(71) Applicant: EATRON TECHNOLOGIES LTD, Warwick (GB)

(72) Inventors: Muharrem Ugur Yavas, Istanbul (TR); Can Kurtulus, Istanbul (TR)

(73) Assignee: Eatron Technologies Limited, Warwick (GB)

( * ) Notice: Subject to any disclaimer, the term of this patent is extended or adjusted under 35 U.S.C. 154(b) by 0 days.

(21) Appl. No.: 18/637,957

(22) Filed: Apr. 17, 2024

(51) Int. Cl.
| | | |
|---|---|---|
| *G05B 13/00* | (2006.01) | |
| *B60L 53/68* | (2019.01) | |
| *G01R 29/24* | (2006.01) | |
| *G01R 31/392* | (2019.01) | |
| *G06N 20/00* | (2019.01) | |
| *H01M 10/44* | (2006.01) | |
| *H02J 7/00* | (2006.01) | |

(52) U.S. Cl.
CPC ........ *H02J 7/007188* (2020.01); *B60L 53/68* (2019.02); *G01R 29/24* (2013.01); *G01R 31/392* (2019.01); *G06N 20/00* (2019.01); *H01M 10/443* (2013.01); *H02J 7/0047* (2013.01); *G05B 2219/14053* (2013.01)

(58) Field of Classification Search
CPC ... H02J 7/007188; H02J 7/0047; B60L 53/68; G01R 29/24; G01R 31/392; G06N 20/00; H01M 10/443
See application file for complete search history.

(56) References Cited

U.S. PATENT DOCUMENTS

| | | | |
|---|---|---|---|
| 11,237,216 B1* | 2/2022 | Chang | G01R 31/388 |
| 2019/0025376 A1* | 1/2019 | Saha | H01M 10/054 |
| 2019/0031035 A1* | 1/2019 | Koch | H01M 10/0525 |
| 2019/0072618 A1* | 3/2019 | Ghantous | H02J 7/005 |
| 2019/0073012 A1* | 3/2019 | Sultenfuss | H02J 7/0068 |
| 2019/0152341 A1* | 5/2019 | Jin | H01M 10/46 |
| 2019/0229378 A1* | 7/2019 | Zhang | B60L 58/16 |
| 2019/0229382 A1* | 7/2019 | Machida | H02J 7/0069 |
| 2019/0280345 A1* | 9/2019 | Spigno | H01M 4/661 |
| 2020/0412153 A1* | 12/2020 | Matsumura | H02J 7/0031 |
| 2021/0263108 A1* | 8/2021 | Li | H01M 10/052 |
| 2023/0052544 A1* | 2/2023 | Yuan | G01R 31/392 |
| 2024/0006675 A1* | 1/2024 | Tanim | H01M 10/48 |
| 2024/0094300 A1* | 3/2024 | Chang | G01R 31/3865 |
| 2024/0094302 A1* | 3/2024 | Chang | H01M 10/4285 |
| 2024/0110984 A1* | 4/2024 | Park | G01R 31/387 |
| 2024/0319278 A1* | 9/2024 | Gope | G01R 31/367 |

FOREIGN PATENT DOCUMENTS

WO    WO-2023172735 A1 *  9/2023

* cited by examiner

*Primary Examiner* — Hien D Khuu
(74) *Attorney, Agent, or Firm* — Dickinson Wright PLLC; Jonathan H. Harder

(57) ABSTRACT

In one aspect, while a battery pack is charging, a computer-implemented method may include predicting an anode potential of the battery pack, and determining whether the anode potential satisfies a threshold condition. Responsive to determining that the anode potential satisfies the threshold condition, the method may include modifying a charging policy of a battery pack to adjust an anode potential offset, and controlling, based on the charging policy, charging of the battery pack to adjust the anode potential offset.

30 Claims, 18 Drawing Sheets

OTA: Over the Air Update
ACM: Adaptive Charge Manager

SYSTEMS AND METHODS OF DYNAMIC ADAPTIVE FAST CHARGING IN BATTERIES TO REDUCE LITHIUM PLATING

TECHNICAL FIELD

This disclosure relates generally to assets and batteries. More specifically, this disclosure relates to systems and methods of dynamic adaptive fast charging in batteries to reduce lithium plating.

BACKGROUND

Many industries involve assets that age and reach End of Life (EOL) states where they are no longer useful. One such example includes energy storage solutions that are prevalent in many assets including personal laptops, mobile phones, electronic watches, rings, and other wearable devices. Further, assets including gate valves used in nuclear reactor control systems, turbofan engines, solid state disks, and other industrial applications are valuable and have limited useful lifetimes. Each asset and/or battery may be prone to degradation issues.

In one example, among various energy storage solutions, Lithium-ion (Li-ion) batteries are widely regarded as promising candidates for various applications due to their advantages of high energy density and low self-discharge. However, the life span of Li-ion batteries is not unlimited, and the cost and aging of Li-ion batteries may be two main factors hindering their development. The performance of Li-ion batteries degrades with time (calendar aging) and use (cycle aging), which is referred to as the aging phenomenon. The aging of the battery may increase operating costs, reduce the service life of the equipment, and affect the safe operation of the equipment.

Moreover, there may not be an ideal solution for recycling of Li-ion batteries. Predictive maintenance may enable mechanisms to be in place for handling of batteries before they reach their EOL reducing demands on recycling. Additionally, premature failures of the batteries may increase demands on re-cycling. Generally, when battery capacity drops below a target threshold i.e. 70-80% of initial battery capacity for an automotive-grade battery, the battery may have reached the end of its service life. The target threshold may vary between different applications.

When Li-ion battery is being charged or discharged, lithium ions move between the negative electrode and the positive electrode. In certain temperatures (e.g., cold) and fast-charging situations, the lithium ions can begin to deposit on the surface of the negative electrode, forming a layer of lithium metal. This phenomenon may be referred to as "lithium plating," which may greatly reduce the battery's lifespan and hinder its fast-charging capabilities. In severe cases, lithium plating may cause short circuits.

SUMMARY

In one aspect, a computer-implemented method may include, while a battery pack is charging, predicting an anode potential of a battery pack, and determining whether the anode potential satisfies a threshold condition. Responsive to determining that the anode potential satisfies the threshold condition, the method may include modifying a charging policy of a battery pack to adjust an anode potential offset, and controlling, based on the charging policy, charging of the battery pack to adjust the anode potential offset.

In one aspect, a computer-implemented method may include receiving, at a cloud-based computing system, historical data comprising (i) battery charging profiles associated with a fleet of vehicles comprising battery packs, (ii) geographical climate information associated with the fleet of vehicles comprising the battery packs, (iii) lithium plating prediction results associated with the fleet of vehicles comprising the battery packs, or (iv) some combination thereof. The method may include training, using the historical data, one or more lithium plating prediction models to predict a likelihood of occurrence of lithium plating for a battery pack, receiving, from an edge processor communicatively coupled to a battery pack, battery pack charging data, determining, using the one or more lithium plating prediction models based on the battery pack charging data, the likelihood of occurrence of lithium plating for the battery pack, based on the likelihood of occurrence of lithium plating for the battery pack, modifying a battery charging policy for the battery pack, and transmitting the battery charging policy for the battery pack to the edge processor to cause the edge processor to control charging of the battery pack based on the battery charging policy.

In one aspect, a computer-implemented method may include determining whether an anode potential offset of a battery pack has reached an upper threshold of a target range. Responsive to determining that the anode potential offset of the battery pack has reached the upper threshold of the target range, the method may include receiving tear-down data associated with the battery pack. The method may include training, based on the tear-down data associated with the battery pack, one or more cloud prediction models that are trained to predict a likelihood of occurrence of lithium plating associated with battery packs, and transmitting, to one or more edge processors of one or more fleet vehicles, one or more parameters associated with the one or more trained prediction models to cause the one or more edge processors to train one or more edge prediction models using the one or more edge processors, wherein the one or more edge processors modify a battery charging policy based on a prediction from the one or more edge prediction models.

In one aspect, a computer-implemented method may include detecting, using one or more monitoring models, a first likelihood of occurrence of lithium plating associated with a portion of a battery pack that is charging, and transmitting, to a cloud-based computing system, information comprising (i) the likelihood of occurrence of lithium plating and (ii) a profile associated with the battery pack. The cloud-based computing system may retrain one or more prediction models based on the information and second information associated with a fleet of battery packs, the one or more prediction models predict a second likelihood of occurrence of the lithium plating associated with the portion of the battery pack that is charging, and, based on the second likelihood of occurrence of the lithium plating, the cloud-based computing system generates a modified charging policy for the battery pack. The method may include receiving, from the cloud-based computing system, the modified charging policy for the battery pack, and the method may include controlling, based on the modified charging policy for the battery pack, charging of the battery pack.

In another aspect, a tangible, non-transitory computer-readable medium may store instructions and a processing device may execute the instructions to perform one or more operations of any method disclosed herein.

In another aspect, a method may include one or more operations implemented by computer instructions and performed by one or more processing devices to perform the techniques disclosed herein.

In another aspect, a system may include one or more memory devices storing instructions, and one or more processing devices communicatively coupled to the one or more memory devices. The one or more processing devices may execute the instructions to perform one or more operations of any method disclosed herein.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, independent of whether those elements are in physical contact with one another. The terms "transmit," "receive," and "communicate," as well as derivatives thereof, encompass both direct and indirect communication. The terms "transmit," "receive," and "communicate," as well as derivatives thereof, encompass both communication with remote systems and communication within a system, including reading and writing to different portions of a memory device. The terms "include" and "comprise," as well as derivatives thereof, mean inclusion without limitation. The term "or" is inclusive, meaning or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "translate" may refer to any operation performed wherein data is input in one format, representation, language (computer, purpose-specific, such as drug design or integrated circuit design), structure, appearance or other written, oral or representable instantiation and data is output in a different format, representation, language (computer, purpose-specific, such as drug design or integrated circuit design), structure, appearance or other written, oral or representable instantiation, wherein the data output has a similar or identical meaning, semantically or otherwise, to the data input. Translation as a process includes but is not limited to substitution (including macro substitution), encryption, hashing, encoding, decoding or other mathematical or other operations performed on the input data. The same means of translation performed on the same input data will consistently yield the same output data, while a different means of translation performed on the same input data may yield different output data which nevertheless preserves all or part of the meaning or function of the input data, for a given purpose. Notwithstanding the foregoing, in a mathematically degenerate case, a translation can output data identical to the input data. The term "controller" means any device, system or part thereof that controls at least one operation. Such a controller may be implemented in hardware or a combination of hardware and software or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable storage medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable storage medium" includes any type of medium capable of being accessed by a computer, such as read only memory (ROM), random access memory (RAM), a hard disk drive, a compact disc (CD), a digital video disc (DVD), solid state drive (SSD), or any other type of memory. A "non-transitory" computer readable storage medium excludes wired, wireless, optical, or other communication links that transport transitory electrical or other signals. A non-transitory computer readable storage medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

FIGS. 1 through 19, discussed below, and the various embodiments used to describe the principles of this disclosure are by way of illustration only and should not be construed in any way to limit the scope of the disclosure.

As the reliance on battery-powered devices and systems increases, from electric vehicles and renewable energy storage to consumer electronics and wearable computing devices, a technical problem arises: effectively increasing the lifetime and fast charging of batteries.

Under ideal conditions, the charge-transfer process of Li-ion batteries may include three steps: (i) de-solvation of solvated Li+ ions (Li+ ions lies within a solution, in order to change location, they separate from the solution and penetrate the Solid Electrolyte Interphase (SEI) as a particle, (ii) Li+ ions pass through the SEI, and (iii) solid-state lithium diffuses into graphite particles. At high charging C rate, Lit ions move fast and a large amount of Lit ions may accumulate at the electrode interface due to the slow lithium solid diffusion, and lithium plating occurs.

Lithium plating may be determined by tearing down the battery and applying visual inspection on the internal structure of the cell. The deposited lithium may be visible as a thin layer of metallic lithium on the surface of the negative electrode. Another way to detect lithium plating is to use a specialized instrument referred to as a scanning electron microscope. This instrument may produce high-resolution images of the battery's internal structure, allowing the deposited lithium to be seen on the surface of the negative electrode.

Figure 6:
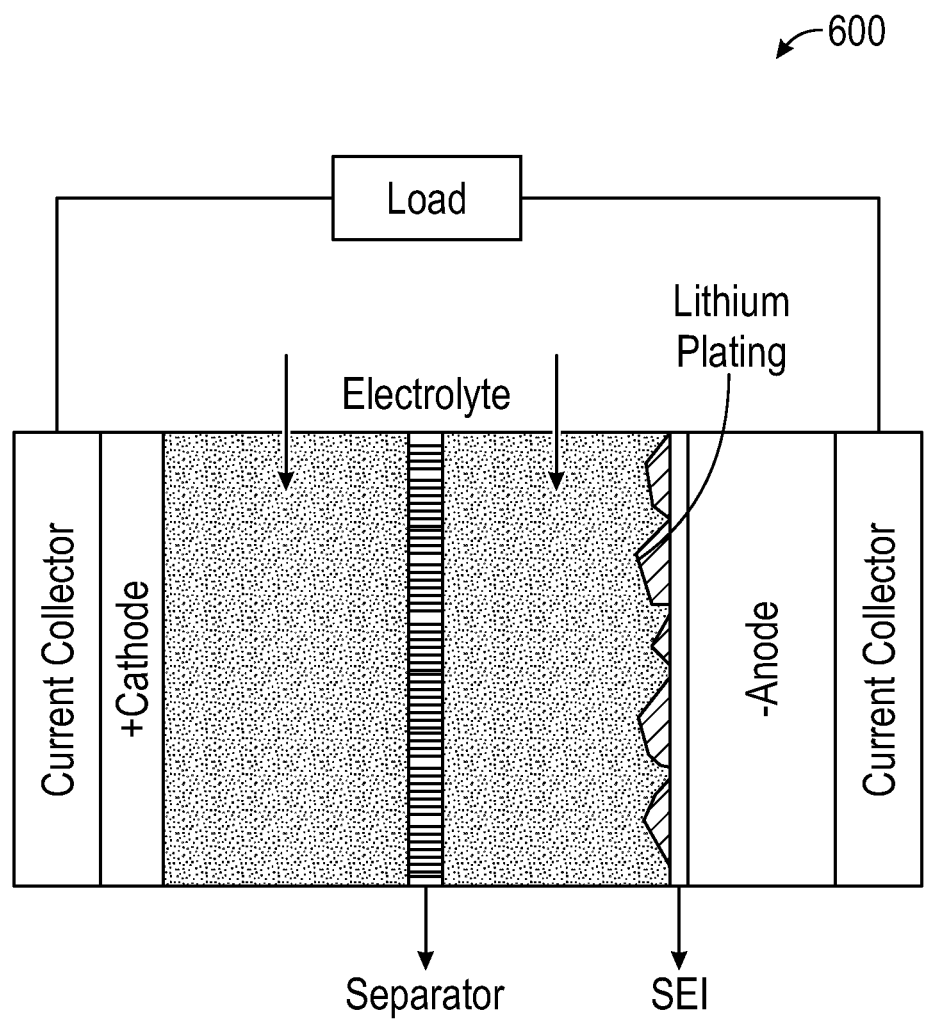
FIG. 6 illustrates an example diagram of a battery cell according to certain embodiments of this disclosure.

A typical Li-ion battery cell 600 is depicted in FIG. 6. The Li-ion battery cell includes an anode, cathode, electrolyte, and separator. The separator may electrically isolate the anode and cathode. The electrolyte may allow Li-ions to travel between the anode and the cathode.

During discharge, positively charged Li-ions move from the negative electrode, the anode, to the positive electrode, the cathode. The Li-ions do this by moving through the electrolyte until they reach the positive electrode. The Li-ions are then intercalated into the positive electrode. The electrons, on the other hand, move from the anode to the cathode through the load. In the case of an electric vehicle, the load is the motor.

During the charging process positive Li-ions from the cathode travel to the anode and intercalate in the anode structure. During this process, some of the Li-ions may not be part of the intercalation reaction (the reaction where Li-ions are inserted between layers of the anode crystal structure), but rather deposit on the surface of the anode, and over the anode solid-electrolyte interphase (SEI) film as metallic lithium. This is referred to as lithium plating. This undesired side reaction may be triggered, most commonly when anode surface potential versus Li/Li+ potential drops below 0 volts. Certain factors such as high charge current and low temperature are known to be more conductive to triggering the lithium plating side reaction. The influence mechanism of these factors are primarily via electrode charge transfer reaction kinetics and ion diffusion processes by typically slowing them down, as well as SEI film impedance by increasing it. Stated another way, high charge current forces the Li-ions to move at a faster reaction rate, leading some to accumulate on the surface of the anode, and the reaction rate slows down at lower temperatures, thus negatively affecting the intercalation of Li-ions.

Lithium plating may be influenced by several factors such as charging speed, temperature, pressure, and local ion concentration. There is a thermodynamic dependency between lithium plating and the potential of the anode surface versus Li/Li+. The minimum potential at the anode surface is the best indicator for the occurrence of lithium plating.

Tear-down analysis accurately evidences lithium plating. However, it is expensive and cumbersome. Tear-down analysis may be very useful when data is intelligently used to build one or more machine learning models to improve accuracy of future predictions for a large pool of batteries such as electric vehicles and mobile phone batteries.

The most severe issue in fast charging is the lithium plating due to the low anode potential. To prevent or reduce the effect of lithium plating, some embodiments disclosed herein monitor the anode potential.

The issue of Anode Potential controlled charging to reduce lithium plating may be complicated when practical battery pack structures are considered in electric vehicles and most mobile and wearable applications. Rechargeable batteries rarely are single cells but in fact consist of combinations of cells into modules and packs.

A battery cell is the most basic unit of a battery, containing an anode, cathode, and electrolyte. These components allow for the movement of ions, creating an electric charge. By themselves, battery cells often don't store enough energy, nor provide a high enough potential (voltage) for many practical applications, which is why they are often combined into larger structures.

Figure 7:
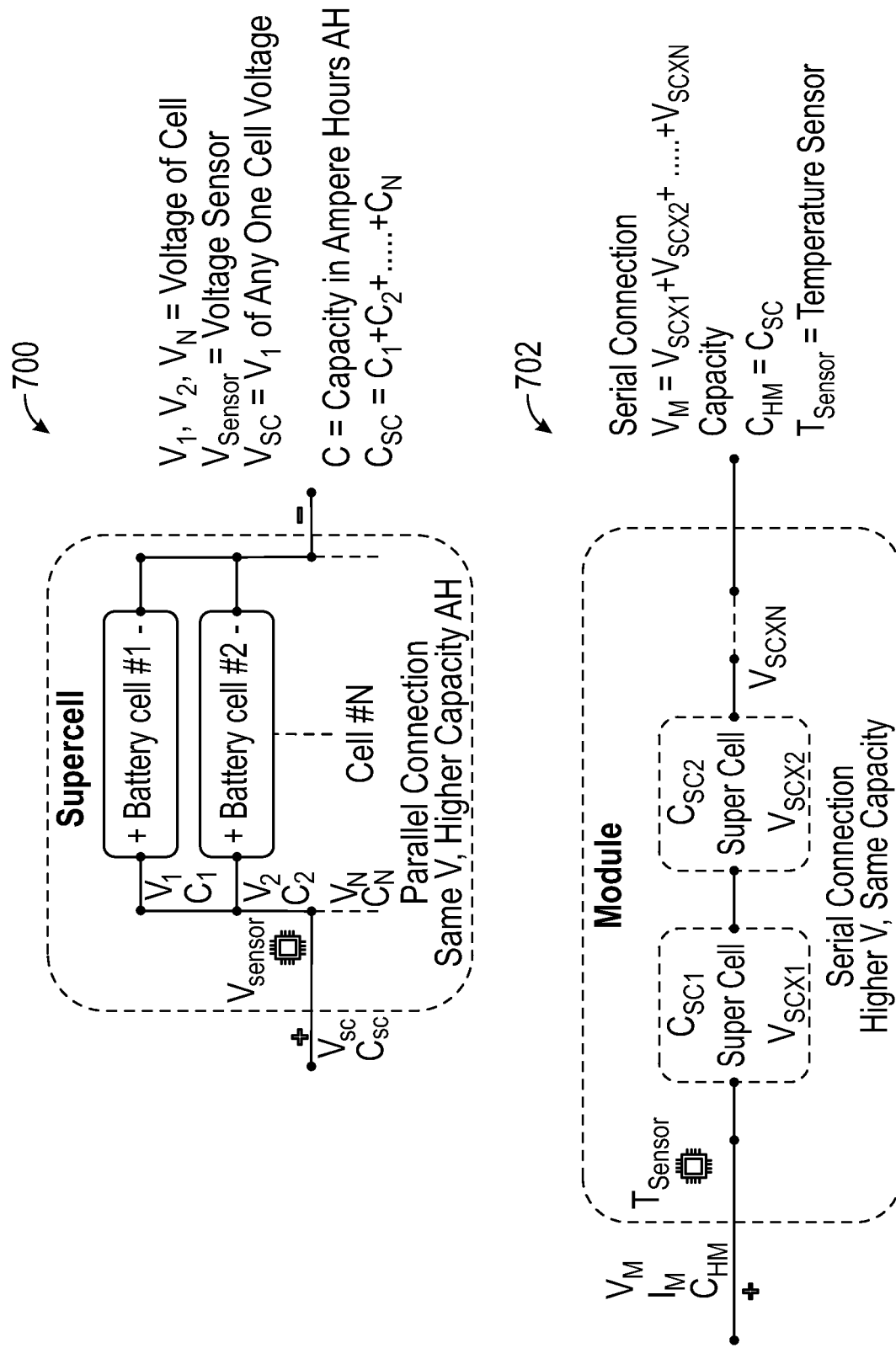
FIG. 7 illustrates example diagrams of a supercell and a module according to certain embodiments of this disclosure.
Figure 8:
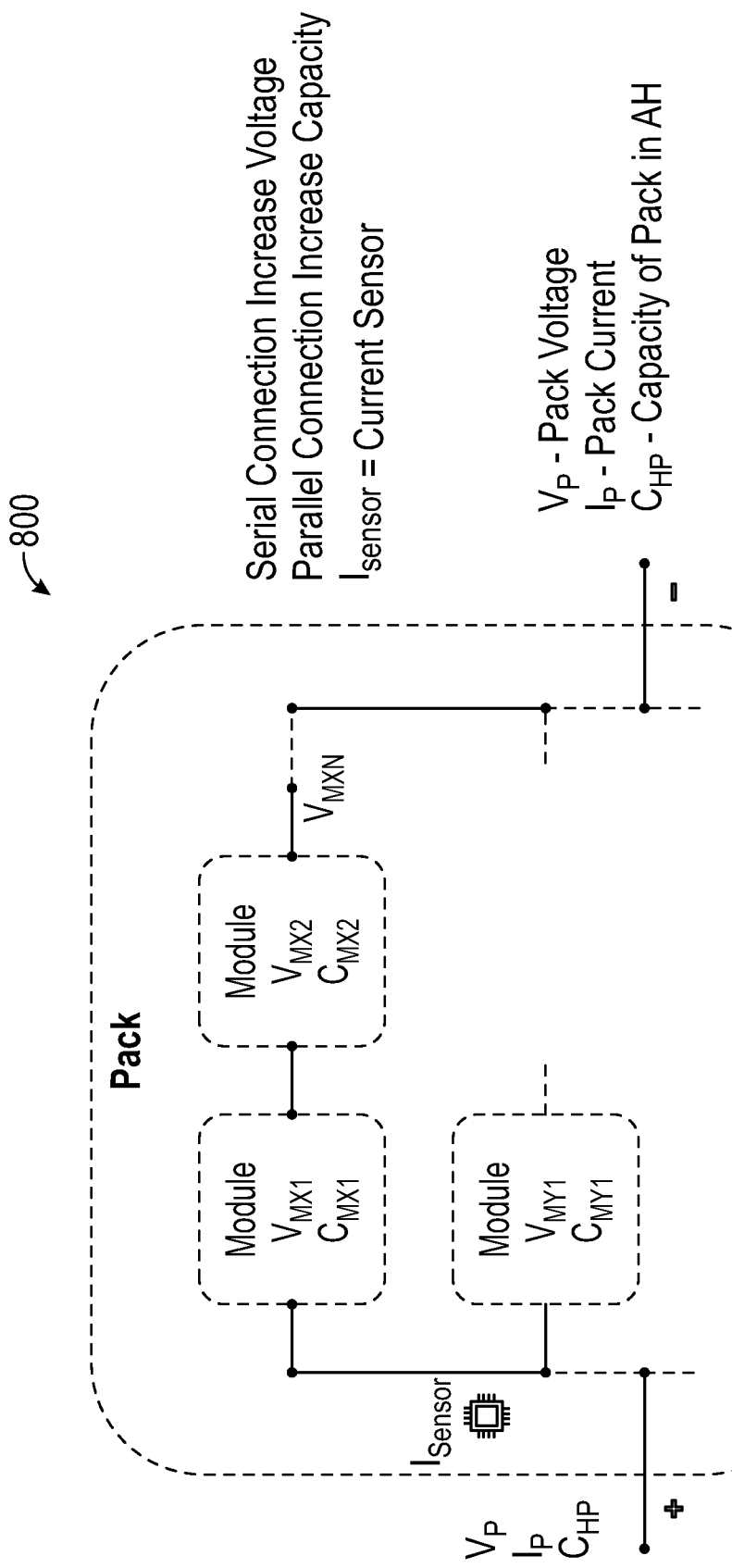
FIG. 8 illustrates an example diagram of a battery pack according to certain embodiments of this disclosure.

Battery packs 800 are made up of multiple interconnected cells, supercells 700, and modules as shown in FIGS. 7 and 8. The cells are usually connected in parallel to create supercells. Supercells have the same voltage of a single cell but they are more powerful in terms of capacity measured in ampere hours (AH). Commonly voltage sensors reside at supercell level. Series connections increase voltage, while parallel connections increase capacity (measured in AH). Supercells are usually connected in series to form modules 702 to achieve desired voltage output. Modules may have temperature sensors. In some cases, a single temperature sensor may monitor multiple modules (e.g., 1, 2, 3, 4, etc.). The exact module configuration may vary depending on the specific electrical and cooling requirements of the application. Modules are then connected in series and/or in parallel to create a pack with required voltage, current, power and cooling requirements. Usually, current sensors reside at the pack level. Packs may have additional components such as current limiters, liquid coolers, etc. to protect them.

In summary, a battery cell is the smallest unit of a battery, supercells are formed by connecting a number of cells in parallel, modules are made up of multiple serially connected supercells, and a battery pack is made up of multiple modules connected in series and parallel. Battery packs may include additional components to manage and protect the system. This hierarchical structure allows for the creation of energy storage systems with a wide range of electrical specifications, physical sizes and performance characteristics, meeting the diverse needs of different applications. FIGS. 7 and 8 illustrate the concepts of cell, serial, parallel connections, creation of supercells, modules and battery packs.

Some embodiments of the present disclosure include a real-time or near real-time, lithium plating monitored, anode potential controlled charging strategy for lithium-ion cells which significantly reduces or eliminates lithium plating under most aggressive conditions, such as fast charging and charging at low temperatures. Use of big data further increases the efficiency and accuracy of our approach.

Our invention is applicable to existing li-ion battery technologies and chemistries, including not widely commercialized ones such as solid state, or semi-solid-state batteries, batteries with li-metal anodes instead of Carbon or Silicon (Si) based anodes (graphite, hard Carbon and any combination of these with Si, as well as pure Si). In addition to li-ion batteries, our invention is also applicable to metal ion batteries with a similar structure and working mechanism such as Na-ion batteries where instead of Lithium, Sodium will plate on the electrodes.

Some embodiments of this disclosure may provide technical benefits such as significant reduction and in some cases total eradication of lithium plating, several fold increase in cycle life of the battery pack, minimal increase in anode resistance, significant reduction in degradation rate in the anode, among other things.

In some embodiments, the disclosed subject matter provides a technical solution to a technical problem of detecting lithium plating that occurs with one or more batteries. Some embodiments may use one or more edge monitoring models to detect lithium plating and may adjust an anode potential offset of a battery pack by modifying a charging policy (value for current, value for voltage). Further, one or more cloud prediction models may be trained using big data including fleet vehicle data to predict a likelihood of occurrence of lithium plating. The output from the one or more cloud prediction models may be used to modify the anode potential offset of the battery pack pre-emptively before lithium plating occurs. Some of the technical solutions may include an adaptive anode potential threshold-based charging using machine learning models. In some embodiments, no sensors may be used to measure anode potential, instead one or more machine learning models may be used to output the anode potential. In some embodiments, the edge monitoring models may maintain anode potential threshold and retrain a neural anode potential model. Continuous unsupervised learning may be deployed with big data for lithium plating monitoring and predicting. The cloud prediction models may pre-emotively adapt anode potential thresholds based on predicted lithium plating. In some embodiments, a connected architecture may enable over the air (over a network) updates for the charging management based on the observed real-world issues. The disclosed techniques may provide increased accuracy with time lapsed lithium plating detection, which may enable extending the useful battery lifetime.

Figure 1:
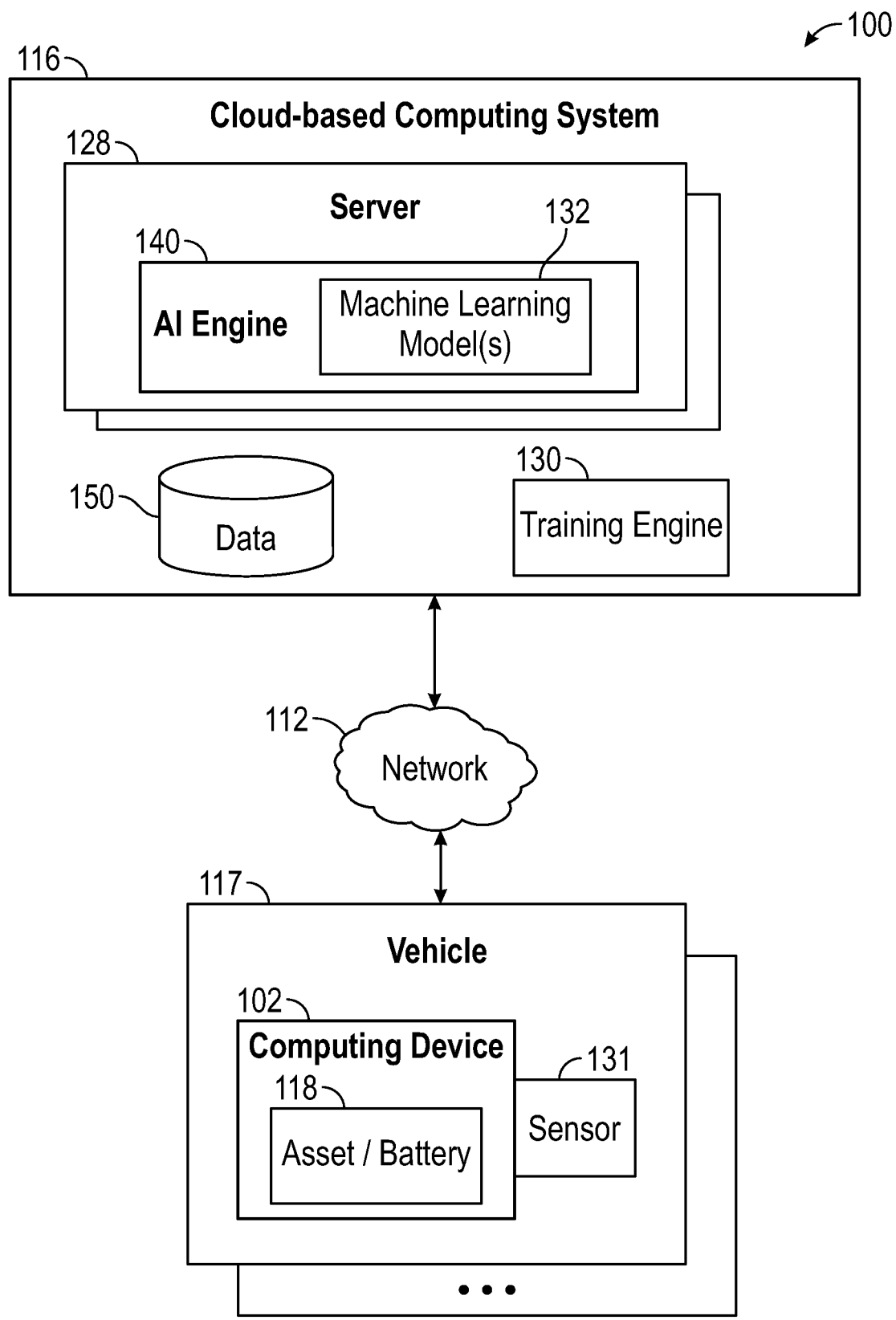
FIG. 1 illustrates a high-level component diagram of an illustrative system architecture according to certain embodiments of this disclosure.

FIG. 1 illustrates a high-level component diagram of an illustrative system architecture 100 according to certain embodiments of this disclosure. In some embodiments, the system architecture 100 may include a cloud-based computing system 116, a computing device 102, and a vehicle 117 communicatively coupled via a network 112. The cloud-based computing system 116 may be a real-time software platform, include privacy software or protocols, or include security software or protocols. Each of the computing device 102 and components included in the cloud-based computing system 116 may include one or more processing devices, memory devices, and/or network interface cards. The network interface cards may enable communication via a wireless protocol for transmitting data over short distances, such as Bluetooth®, ZigBee®, NFC, etc. Additionally, the network interface cards may enable communicating data via a wired protocol over short or long distances, and in one example, the computing device 102 and/or the cloud-based computing system 116 may communicate with the network 112. Network 112 may be a public network (e.g., connected to the Internet via wired (Ethernet) or wireless (WiFi)), a private network (e.g., a local area network (LAN) or wide area network (WAN)), or a combination thereof. In some embodiments, network 112 may also comprise a node or nodes on the Internet of Things (IoT).

The computing device 102 may be any suitable computing device, such as an embedded computer device with display, a laptop, tablet, smartphone, or computer. The computing device 102 may be included within a vehicle, such as an electric vehicle. The computing device 102 may be separate from the vehicle 117. The computing device 102 may include a display capable of presenting a user interface of an application. The application may be implemented in computer instructions stored on the one or more memory devices of the computing device 102 and executable by the one or more processing devices of the computing device 102. The computing device may include an asset and/or battery pack 118 pack, each of which may have a useful life that degrades over time. The asset and/or battery pack 118 may be used to charge and power a vehicle (e.g., electric vehicle), smartphone, appliance, or any suitable device that uses a battery.

The user interface may present various screens to a user that present various views including notifications of when lithium plating is detected for one or more battery cells and/or one or more battery packs. The user interface may enable performing a preventive action such as presenting a signal (e.g., warning signal that the lithium plating is present) and/or changing an operating parameter of the vehicle to consume less energy from the battery, and the like. The computing device 102 may also include instructions stored on the one or more memory devices that, when executed by the one or more processing devices of the computing device 102, perform operations of any of the methods described herein.

The vehicle 117 may be any suitable type of vehicle or electric vehicle, such as an automobile, a motorcycle, a boat, an airplane, a bicycle, a scooter, a skateboard, roller skates, roller blades, a unicycle, a surfboard, a drone, or the like. Accordingly, the vehicle 117 may include an engine that is powered by one or more batteries, assets, and motors. The vehicle may also include one or more sensors 131 that are configured to measure any suitable operating parameter of a vehicle, a temperature of the vehicle 117, a vibration of the vehicle 117, a battery pack current, a battery pack cell voltage, a battery pack cell temperature, etc. The sensors 131 may include an accelerometer, a current sensor, a voltage sensor, a temperature sensor, a thermal sensor, a camera, or the like. The processing device of the vehicle 117 may receive the measurements from the one or more sensors 131 and transmit them via the network 112 to the cloud-based computing system 116 for use in training one or more machine learning models 132. In some embodiments, when a machine learning model is trained and ready to process real-time data, the processing device of the vehicle 117 may receive the measurements from the one or more sensors 131 and use them, along with other data (e.g., a user battery usage profile), to predict lithium plating of the battery pack and/or asset 118. The vehicle 117 may also execute an instance of a machine learning model 132 that is trained using parameters received from a cloud-based machine learning model 132.

In some embodiments, the cloud-based computing system 116 may include one or more servers 128 that form a distributed computing system, which may include a cloud computing system. The servers 128 may be a rackmount server, a router, a personal computer, a portable digital assistant, a mobile phone, a laptop computer, a tablet computer, a camera, a video camera, a netbook, a desktop computer, a media center, any other device capable of functioning as a server, or any combination of the above. Each of the servers 128 may include one or more processing devices, memory devices, data storage, or network interface cards. The servers 128 may be in communication with one another via any suitable communication protocol. The servers 128 may execute an artificial intelligence engine 140 and one or more machine learning models 132, as described further herein.

That is, the servers 128 may execute an artificial intelligence (AI) engine 140 that uses one or more machine learning models 132 to perform at least one of the embodiments disclosed herein. The cloud-based computing system 116 may also include a database 150 that stores data, knowledge, and data structures used to perform various embodiments. For example, the database 150 may store fleet of electric vehicles' data, battery data (e.g., original anode thickness, expected cycle loss, etc.) received from a manufacturer of the battery, lab experiment data pertaining to the battery, user battery usage profile, lithium plating data, etc. Although depicted separately from the server 128, in some embodiments, the database 150 may be hosted on one or more of the servers 128.

In some embodiments, the cloud-based computing system 116 may include a training engine 130 capable of generating one or more machine learning models 132. Although depicted separately from the AI engine 140, the training engine 130 may, in some embodiments, be included in the AI engine 140 executing on the server 128. In some embodiments, the AI engine 140 may use the training engine 130 to generate the machine learning models 132 trained to perform inferencing and/or predicting operations. The machine learning models 132 may be trained to predict a likelihood of lithium plating occurrence, anode potential, among other things. The one or more machine learning models 132 may be generated by the training engine 130 and may be implemented in computer instructions executable by one or more processing devices of the training engine 130 or the servers 128. To generate the one or more machine learning models 132, the training engine 130 may train the one or more machine learning models 132. The one or more machine learning models 132 may be used by any of the methods described herein.

The training engine 130 may be a rackmount server, a router, a personal computer, a portable digital assistant, a smartphone, a laptop computer, a tablet computer, a netbook, a desktop computer, an Internet of Things (IoT) device, any other desired computing device, or any combination of the above. The training engine 130 may be cloud-based, be a real-time software platform, include privacy software or protocols, or include security software or protocols.

To generate the one or more machine learning models 132, the training engine 130 may train the one or more machine learning models 132. The training engine 130 may use a base training data set including inputs of labeled data (e.g., assigned a value of 1) associated with lithium plating and labeled data (e.g., assigned a value of 0) not associated with lithium plating, among other things. The training data may include labeled inputs of battery management system inputs (e.g., cell current, cell voltage, cell temperature, state of charge, state of health, charging time, amount of charge, power level, other charging information, etc.) mapped to labeled outputs of probability of lithium plating. One or more combinations of the inputs may be mapped to an output pertaining to an occurrence of lithium plating of each cell of the battery pack. In some embodiments, one or more machine learning models 132 may be used as one or more lithium plating edge monitoring models and/or edge prediction models, as described further herein.

The one or more machine learning models 132 may refer to model artifacts created by the training engine 130 using training data that includes training inputs and corresponding target outputs. The training engine 130 may find patterns in the training data wherein such patterns map the training input to the target output and generate the machine learning models 132 that capture these patterns. Although depicted separately from the server 128, in some embodiments, the training engine 130 may reside on server 128. Further, in some embodiments, the artificial intelligence engine 140, the database 150, or the training engine 130 may reside on the computing device 102.

As described in more detail below, the one or more machine learning models 132 may comprise, e.g., a single level of linear or non-linear operations (e.g., a support vector machine (SVM) or the machine learning models 132 may be a deep network, i.e., a machine learning model comprising multiple levels of non-linear operations. Examples of deep networks are neural networks, including generative adversarial networks, convolutional neural networks, recurrent neural networks with one or more hidden layers, and fully connected neural networks (e.g., each artificial neuron may transmit its output signal to the input of the remaining neurons, as well as to itself). For example, the machine learning model may include numerous layers or hidden layers that perform calculations (e.g., dot products) using various neurons. In some embodiments, the one or more machine learning models 132 may be trained via supervised learning, unsupervised learning, and/or reinforcement learning.

The machine learning model 132 may be trained to use causal inference by accepting one or more inputs, such as (i) assumptions, (ii) queries, and (iii) data. The machine learning model 132 may be trained to output one or more outputs, such as (i) a decision as to whether a query may be answered, (ii) an objective function (also referred to as an estimand or estimated) that provides an answer to the query for any received data, and (iii) an estimated answer to the query and an estimated uncertainty of the answer, where the estimated answer is based on the data and the objective function, and the estimated uncertainty reflects the quality of data (i.e., a measure which takes into account the degree or salience of incorrect data or missing data). The assumptions may also be referred to as constraints and may be simplified into statements used in the machine learning model 132. The queries may refer to scientific questions for which the answers are desired.

Figure 2:
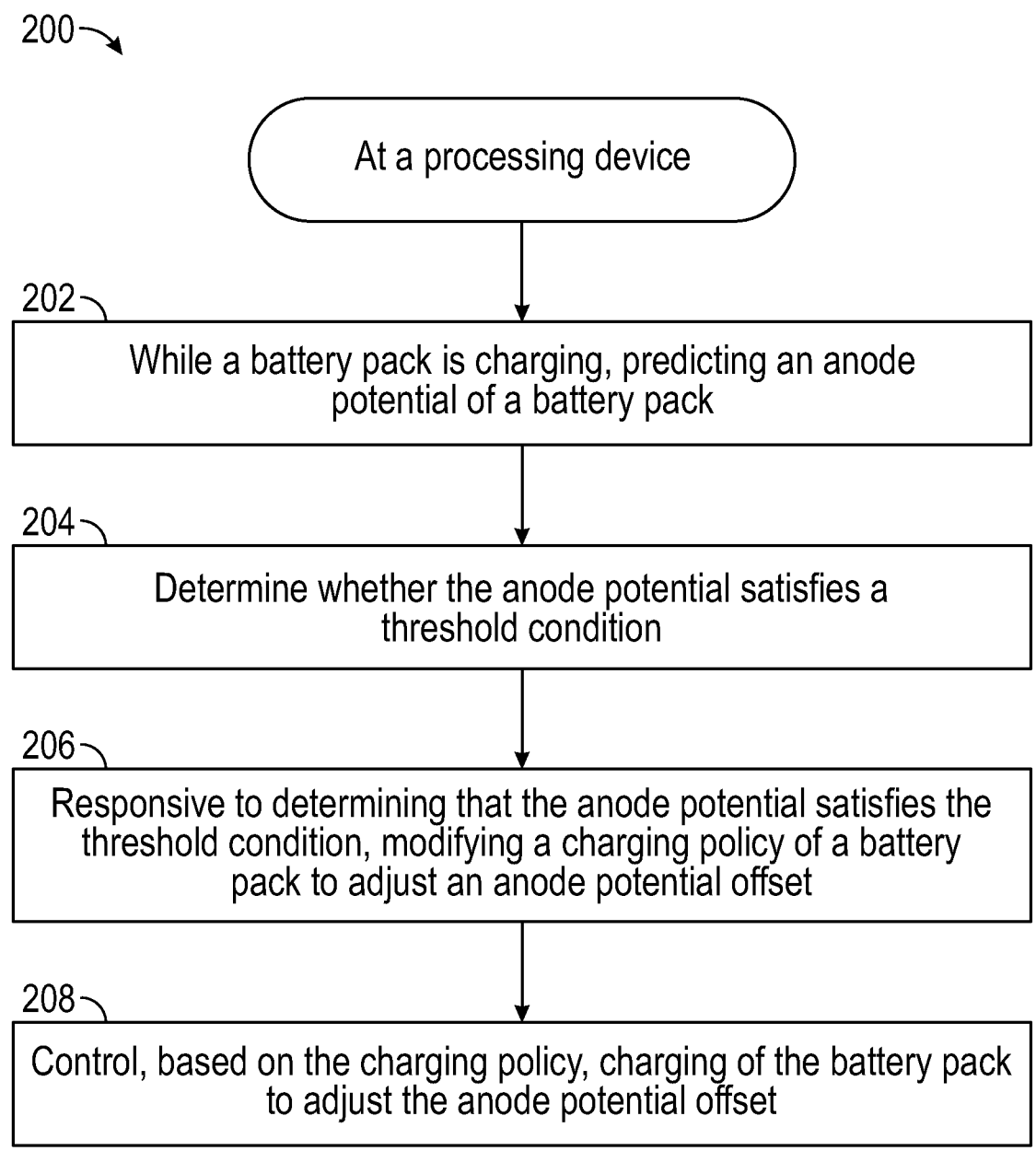
FIG. 2 illustrates example operations of a method for modifying a charging policy of a battery pack based on an anode potential satisfying a threshold condition according to certain embodiments of this disclosure.

FIG. 2 illustrates example operations of a method 200 for modifying a charging policy of a battery pack based on an anode potential satisfying a threshold condition according to certain embodiments of this disclosure. The method 200 is performed by processing logic that may include hardware (circuitry, dedicated logic, etc.), software (such as is run on a computer system or specialized dedicated machine), or a combination of both. The method 200 or each of their individual functions, routines, subroutines, or operations may be performed by one or more processors of a computing device (e.g., any component of FIG. 1, such as server 128 executing the artificial intelligence engine 140). In certain implementations, the method 200 may be performed by a single processing thread. Alternatively, the method 200 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 200 may be performed by the training engine 130 of FIG. 1.

For simplicity of explanation, the method 200 is depicted and described as a series of operations. However, operations in accordance with this disclosure can occur in various orders or concurrently, and with other operations not presented and described herein. For example, the operations depicted in the method 200 may occur in combination with any other operation of any other method disclosed herein. Furthermore, not all illustrated operations may be required to implement the method 200 in accordance with the disclosed subject matter. In addition, those skilled in the art will understand and appreciate that the method 200 could alternatively be represented as a series of interrelated states via a state diagram or events.

In some embodiments, one or more machine learning models may be generated and trained by the artificial intelligence engine and/or the training engine to perform one or more of the operations of the methods described herein. For example, to perform the one or more operations, the processing device may execute the one or more machine learning models. In some embodiments, the one or more machine learning models may be iteratively retrained to select different features capable of enabling optimization of output. The features that may be modified may include a number of nodes included in each layer of the machine learning models, an objective function executed at each node, a number of layers, various weights associated with outputs of each node, and the like.

At 202, while a battery pack is charging, the processing device may predict an anode potential of the battery pack. In some embodiments, the anode potential may be predicted without using a sensor coupled to the battery pack. In some embodiments, the anode potential is predicted using a sensor coupled to the battery pack (e.g., coupled to the anode of a battery cell, or to the battery cell itself).

In some embodiments, predicting the anode potential of the battery pack may include using inputs pertaining to battery data to train a pseudo-two-dimensional physics-based model to output the predicted anode potential. The battery data may include current, temperature, or some combination thereof. Further, predicting the anode potential of the battery pack may include training one or more machine learning models using labeled data including the battery data as inputs and the predicted anode potential as outputs.

In some embodiments, one or more edge processors or processing devices may execute one or more trained machine learning models to predict the anode potential. In some embodiments the cloud-based computing system 116 may be used to execute one or more trained machine learning models to predict the anode potential.

At 204, the processing device may determine whether the anode potential satisfies a threshold condition.

At 206, responsive to determining that the anode potential satisfies the threshold condition, the processing device may modify a charging policy of a battery pack to adjust an anode potential offset (anode potential offset may refer to anode potential of a specific region of voltage at the anode and may cover a range of negative to positive (e.g., −5 millivolts to 15 millivolts) for different battery technologies). In some embodiments, modifying the charging policy of the battery pack may include determining a new anode potential offset to create a more conservative charging policy. In some embodiments, the charging policy may include values for current, voltage, or both to be used to charge the battery pack.

At 208, the processing device controls, based on the charging policy, charging of the battery pack to adjust the anode potential offset.

In some embodiments, the processing device may receive, from the cloud-based computing system 116, one or more parameters pertaining to predicting the anode potential. The one or more parameters may be determined based on fleet vehicle historical data (fleet vehicles may refer to multiple electric vehicles) pertaining to anode potential of fleet battery packs. In some embodiments, the processing device may retrain, at an edge processor, one or more machine learning models using the one or more parameters to predict the anode potential for subsequent charging cycles.

Figure 3:
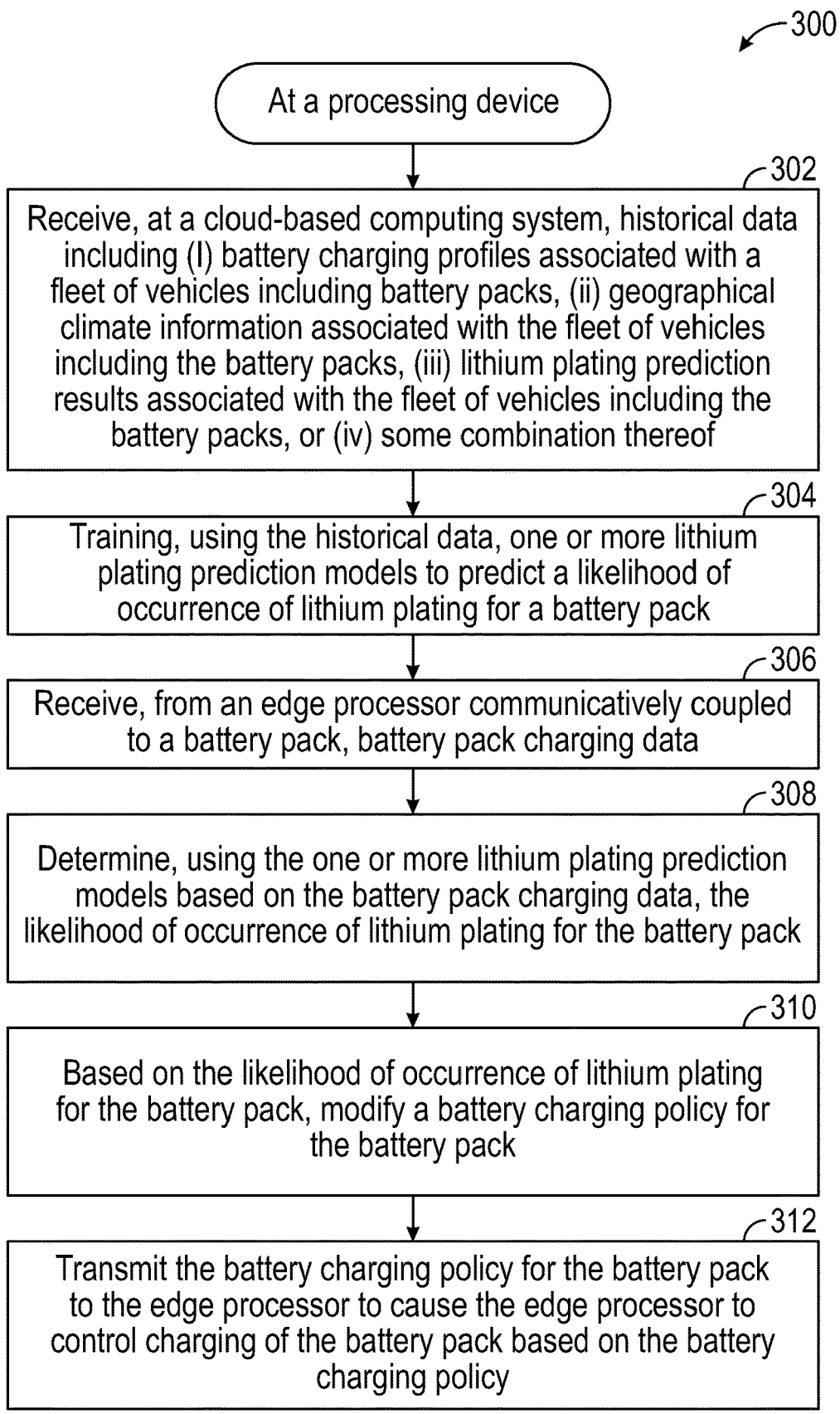
FIG. 3 illustrates example operations of a method for using one or more cloud lithium plating prediction models to preemptively adjust a charging policy of a battery pack to reduce lithium plating according to certain embodiments of this disclosure.

FIG. 3 illustrates example operations of a method 300 for using one or more cloud lithium plating prediction models to preemptively adjust a charging policy of a battery pack to reduce lithium plating according to certain embodiments of this disclosure. The method 300 is performed by processing logic that may include hardware (circuitry, dedicated logic, etc.), software (such as is run on a computer system or specialized dedicated machine), or a combination of both. The method 300 or each of their individual functions, routines, subroutines, or operations may be performed by one or more processors of a computing device (e.g., any component of FIG. 1, such as server 128 executing the artificial intelligence engine 140, or a processing device of the vehicle 117). In certain implementations, the method 300 may be performed by a single processing thread. Alternatively, the method 300 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 300 may be performed by the training engine 130 of FIG. 1. The method 300 may be performed in a similar manner as the method 200 of FIG. 2.

At 302, the processing device may receive, at the cloud-based computing system 116, historical data including (i) battery charging profiles (e.g., cell voltages, currents, temperatures, modified anode potential offsets, and lithium plating information (e.g., quantity, severity, etc.)) associated with a fleet of vehicles including battery packs, (ii) geographical climate information associated with the fleet of vehicles including the battery packs, (iii) lithium plating prediction results associated with the fleet of vehicles including the battery packs, or (iv) some combination thereof.

At 304, the processing device may train, using the historical data, one or more lithium plating prediction models to predict a likelihood of occurrence of lithium plating for a battery pack.

At 306, the processing device may receive, from one or more edge processors communicatively coupled to a battery pack, battery pack charging data. The battery pack charging data is associated with a battery pack of a vehicle and the likelihood of occurrence of lithium plating for the battery pack may be determined in real-time (e.g., less than 2 seconds) or near real-time (e.g., greater than 2 seconds and less than 30 seconds) to perform a pre-emptive intervention by modifying the battery charging policy for the battery pack.

At 308, the processing device may determine, using the one or more lithium plating prediction models based on the battery pack charging data, the likelihood of occurrence of lithium plating for the battery pack. In some embodiments, the one or more lithium plating prediction models may include one or more trained machine learning models. In some embodiments, the one or more lithium plating prediction models may be trained to predict the likelihood of occurrence of lithium plating by predicting an anode potential of the battery pack.

At 310, based on the likelihood of occurrence of lithium plating for the battery pack, the processing device may modify a battery charging policy for the battery pack. In some embodiments, modifying the charging policy for the battery pack may include modifying an anode potential offset of the battery pack.

At 312, the processing device may transmit the battery charging policy for the battery pack to the edge processor to cause the edge processor to control charging of the battery pack based on the battery charging policy.

In some embodiments, the processing device may receive, from one or more edge processors associated with a vehicle including the battery pack, a notification that an anode potential offset cannot be adjusted further and the battery pack is a tear-down candidate. In some embodiments, the processing device may receive cell tear-down data pertaining to the fleet of vehicles including the battery packs. In some embodiments, the processing device may retrain, using the cell tear-down data, the one or more lithium plating prediction models to predict the likelihood of occurrence of lithium plating for the battery pack.

In some embodiments, the processing device may transmit one or more parameters of the one or more lithium plating prediction models to one or more edge processors to cause the one or more edge processors to retrain one or more edge machine learning models.

Figure 4:
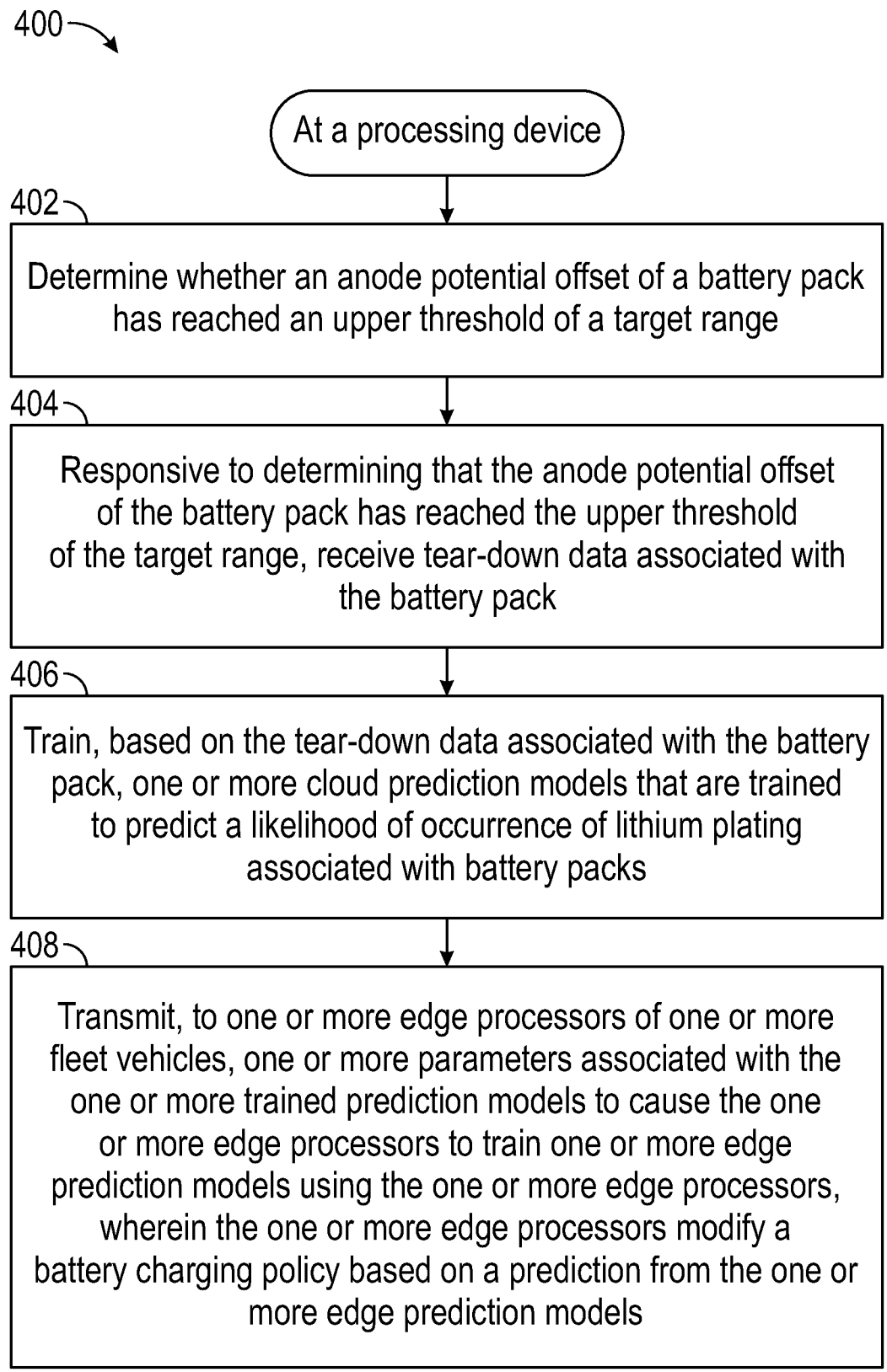
FIG. 4 illustrates example operations of a method for using tear-down data to train one or more cloud lithium plating prediction models to predict a likelihood of occurrence of lithium plating associated with battery packs according to certain embodiments of this disclosure.

FIG. 4 illustrates example operations of a method 400 for using tear-down data to train one or more cloud lithium plating prediction models to predict a likelihood of occurrence of lithium plating associated with battery packs according to certain embodiments of this disclosure. The method 400 is performed by processing logic that may include hardware (circuitry, dedicated logic, etc.), software (such as is run on a computer system or specialized dedicated machine), or a combination of both. The method 400 or each of their individual functions, routines, subroutines, or operations may be performed by one or more processors of a computing device (e.g., any component of FIG. 1, such as server 128 executing the artificial intelligence engine 140). In certain implementations, the method 400 may be performed by a single processing thread. Alternatively, the method 400 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 400 may be performed by the training engine 130 of FIG. 1. The method 400 may be performed in a similar manner as the method 200 of FIG. 2.

At 402, the processing device may determine whether an anode potential offset of a battery pack has reached an upper threshold of a target range. In some embodiments, the anode potential offset is received from one or more edge processors of a vehicle associated with the battery pack.

At 404, responsive to determining that the anode potential offset of the battery pack has reached the upper threshold of the target range, the processing device may receive tear-down data associated with the battery pack. In some embodiments, the tear-down data may include precise information on how severe lithium plating is (e.g., a measured quantity, amount, value, percentage, etc. of lithium plating). The tear-down data may include a severity level of the lithium plating associated with the battery pack. The processing device may compare the severity level (e.g., real amount of lithium plating that occurred) with the predicted likelihood of occurrence of lithium plating associated with the battery pack output by the one or more cloud lithium plating prediction models and/or the one or more edge monitoring models. If the real amount of lithium plating that occurred is within a threshold difference range, then there may be no action performed. If the real amount of lithium plating that occurred is outside the threshold difference range, then the one or more cloud lithium plating prediction models may be retrained based on the tear-down data. Thus, the processing device may determine whether to retrain the one or more cloud lithium plating prediction models based on the comparison. This method, continuous learning, ensures that the lithium plating prediction system gets more accurate progressively.

At 406, the processing device may train, based on the tear-down data associated with the battery pack, one or more cloud prediction models that are trained to predict a likelihood of occurrence of lithium plating with battery packs. The one or more cloud prediction models (e.g., one or more cloud lithium plating prediction models) may include one or more machine learning models.

At 408, the processing device may transmit, to one or more edge processors of one or more fleet vehicles, one or more parameters associated with the one or more trained prediction models to cause the one or more edge processors to train one or more edge prediction models using the one or more edge processors. The one or more edge processors may modify a battery charging policy based on a prediction from the one or more edge prediction models. The battery charging policy may include a value for current, voltage, or both to apply to a battery charger to charge the battery pack.

In some embodiments, the processing device may receive battery pack data associated with a vehicle. The processing device may predict, using the one or more cloud prediction models and based on the battery pack data, the likelihood of occurrence of the lithium plating associated with the battery pack. In some embodiments, based on the prediction, the processing device may pre-emptively intervene by modifying an anode potential offset of a battery pack associated with the vehicle. The pre-emptive intervention may include generating a modified battery charging policy with different current and/or voltage values than a battery charging policy currently being executed by a state of power application associated with a vehicle. The modified charging policy may be transmitted from the cloud-based computing system 116 to the one or more edge processors of the vehicle, and the one or more edge processors may input the modified charging policy into the state of power application for execution. The state of power application may execute the modified battery charging policy to control the battery charger, which modifies the anode potential offset of the battery pack associated with the vehicle.

Figure 5:
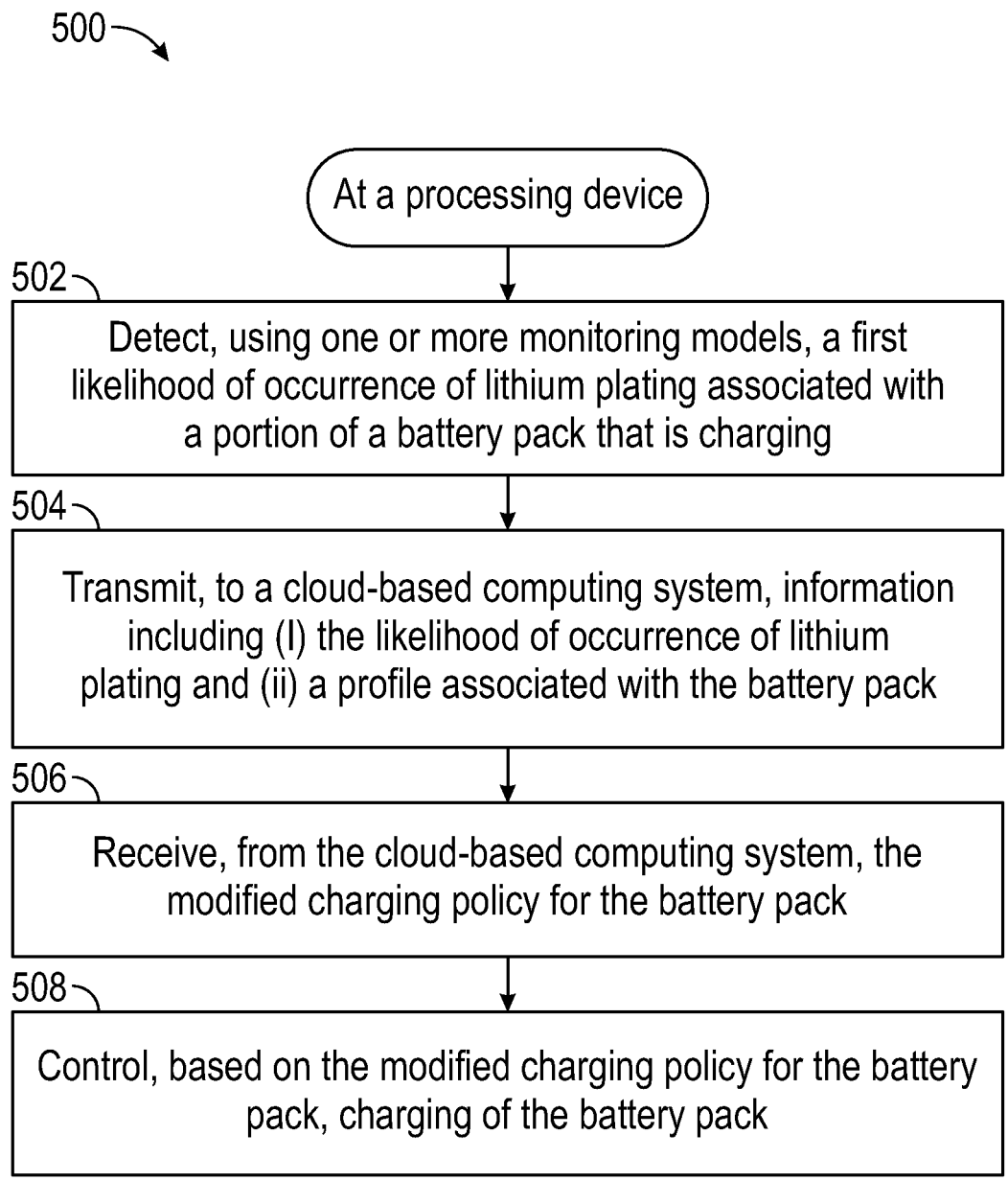
FIG. 5 illustrates example operations of a method for executing, using one or more edge processors, one or more monitoring models and executing, using a cloud-based computing system, one or more prediction models to modify a charging policy of a battery pack to reduce lithium plating according to certain embodiments of this disclosure.

FIG. 5 illustrates example operations of a method 500 for executing, using one or more edge processors, one or more monitoring models and executing, using a cloud-based computing system, one or more prediction models to modify a charging policy of a battery pack to reduce lithium plating according to certain embodiments of this disclosure. The method 500 is performed by processing logic that may include hardware (circuitry, dedicated logic, etc.), software (such as is run on a computer system or specialized dedicated machine), or a combination of both. The method 500 or each of their individual functions, routines, subroutines, or operations may be performed by one or more processors of a computing device (e.g., any component of FIG. 1, such as server 128 executing the artificial intelligence engine 140). In certain implementations, the method 500 may be performed by a single processing thread. Alternatively, the method 500 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 500 may be performed by the training engine 130 of FIG. 1. The method 500 may be performed in a similar manner as the method 200 of FIG. 2.

At 502, the processing may detect, using one or more monitoring models, a first likelihood of occurrence of lithium plating associated with a portion of a battery pack that is charging. In some embodiments, the one or more monitoring models may include one or more machine learning models. The one or more monitoring models may be implemented in computer instructions stored on one or more memory devices and executed by one or more processing devices. In some embodiments, the first likelihood of occurrence of lithium plating may be detected based on a predicted anode potential of the battery pack.

At 504, the processing device may transmit, to the cloud-based computing system 116, information including (i) the first likelihood of occurrence of lithium plating, and (ii) a profile associated with the battery pack. In some embodiments, the cloud-based computing system 116 may retrain one or more prediction models based on the information and second information associated with a fleet of battery packs (e.g., multiple battery packs). The one or more prediction models may predict a second likelihood of occurrence of the lithium plating associated with the portion of the battery pack that is charging. In some embodiments, the one or more prediction models may include one or more machine learning models. In some embodiments, the one or more prediction models may be implemented in computer instructions stored on one or more memory devices and executed by one or more processing devices.

In some embodiments, based on the second likelihood of occurrence of the lithium plating, the cloud-based computing system 116 may generate a modified charging policy for the battery pack. In some embodiments, the modified charging policy may include a specified value for a current, voltage, or both. In some embodiments, the modified charging policy may modify an anode potential offset of the battery pack.

At 506, the processing device may receive from the cloud-based computing system 116, the modified charging policy for the battery pack.

At 508, the processing device may control, based on the modified charging policy for the battery pack, charging of the battery pack.

In some embodiments, the processing device may determine whether an anode potential offset of the portion of the battery pack has reached a certain threshold. Responsive to determining that the anode potential offset of the portion of the battery pack has reached the certain threshold, the processing device may transmit a notification to the cloud-based computing system 116 indicate that the battery pack is a tear-down candidate. The notification may include battery pack data pertaining to the battery pack. In some embodiments, the notification may cause the cloud-based computing system 116 to retrain the one or more prediction models using the battery pack data.

Figure 9:
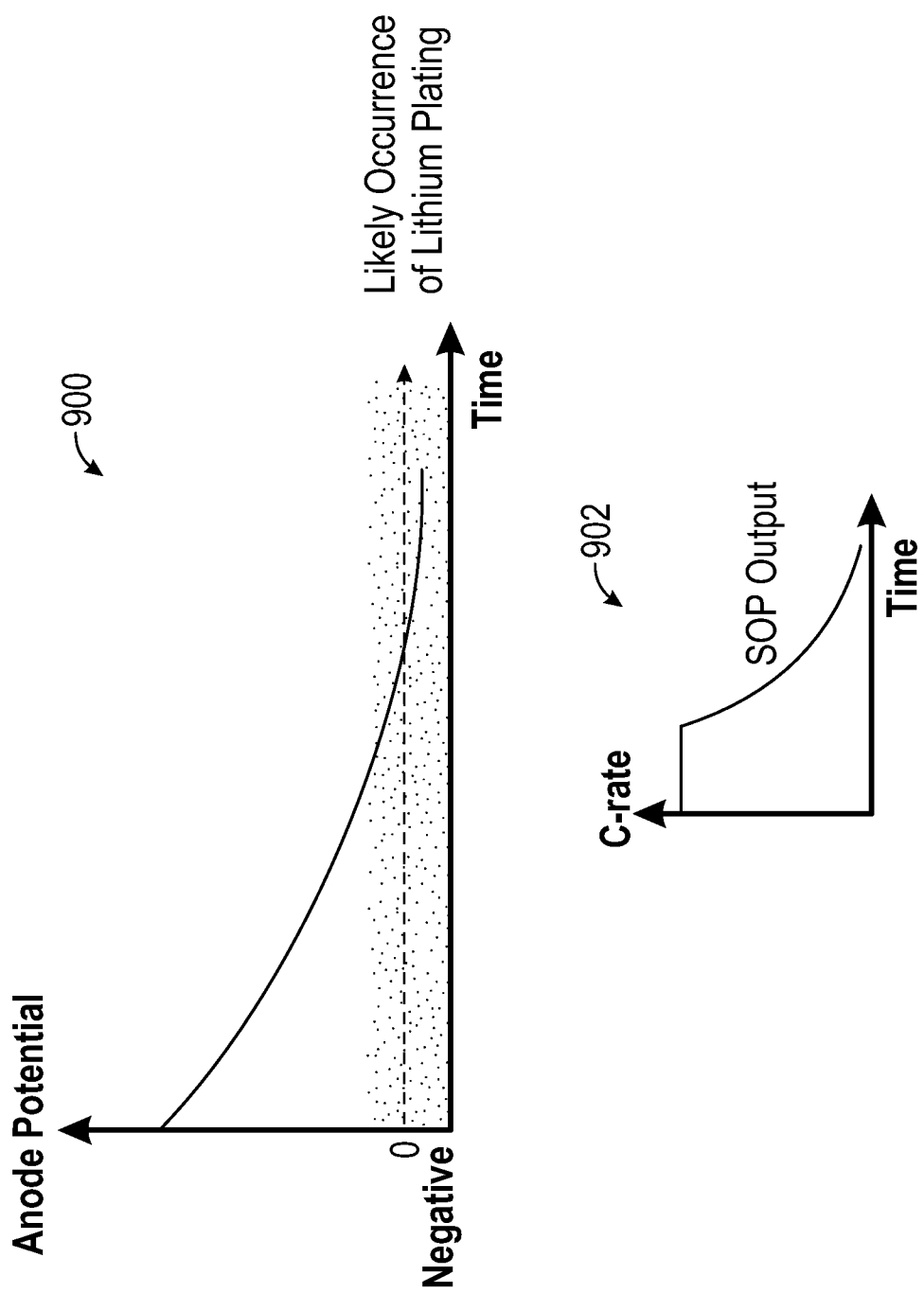
FIG. 9 illustrates example graphs for anode potential and state of power according to certain embodiments of this disclosure.

FIG. 9 illustrates example graphs 900 and 902 for anode potential and state of power according to certain embodiments of this disclosure. In some embodiments, the disclosed techniques implement anode potential controlled charging by monitoring the negative electrode (anode) potential during charging. Lithium plating may occur when the anode potential falls below a specific threshold, causing Li-ions to deposit as metallic lithium on the electrode surface. By controlling the charging current and/or voltage based on the measured anode potential, some embodiments of the present disclosure can mitigate, reduce, and/or avoid the lithium plating occurrence for battery packs. In some embodiments, the disclosed techniques may accurately predict and/or estimate the anode potential, which may provide a technical solution for accurate and real-time or near real-time anode potential monitoring without using invasive sensors. In some embodiments, the anode potential may be measured via one or more sensors.

As depicted by the graph 900, the likelihood of occurrence of lithium plating increases as the anode potential decreases. In particular, when the anode potential gets close to and drops below 0 volts, lithium plating is likely occurring.

With reference to the graph 902, a charging policy may be determined by a state of power (SOP) application. A C-rate may represent a charging rate relative to the battery's nominal capacity (normalized current with respect to the nominal capacity). A C-rate of 1 means the battery is charged at its full capacity in 1 hour (e.g., 100 AH battery charged at 100 A). As depicted, the SOP output declines over time because, as batteries age, they degrade. Degradation means that the battery charges to a lower power and voltage htan original. For example, a lithium ion battery may charge to 95% of its original level. When a battery only charges to 80% of its original levels, it is end of life.

Figure 10:
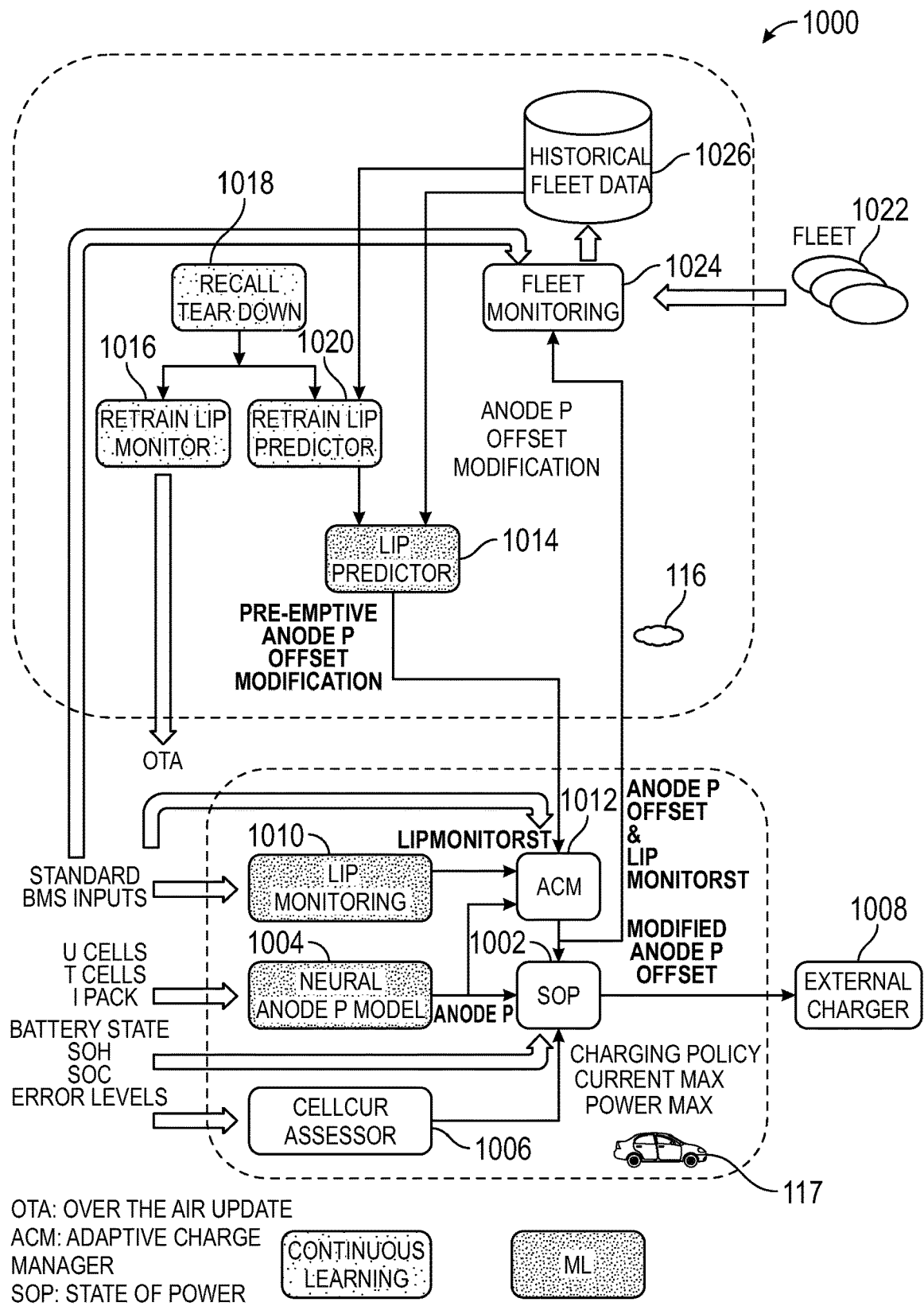
FIG. 10 illustrates an example architecture for lithium plating prediction and adaptive battery charging according to certain embodiments of this disclosure.

FIG. 10 illustrates an example architecture 1000 for lithium plating prediction and adaptive battery charging according to certain embodiments of this disclosure. Each of the components, functions, applications, programs, methods, models, modules, routines, etc. depicted in the cloud-based computing system 116 and/or the vehicle 117 of FIG. 10 may be implemented in computer instructions stored on one or more memory devices and executed by one or more processing devices. Initially, the disclosed system may deploy with a fast battery charging policy and robust lithium plating monitoring capabilities to the edge (e.g., one or more edge processors associated with a vehicle 117). A state of power (SOP) application 1002 may generate a battery charging policy based on a neural anode potential model 1004 (e.g., anode potential), battery management states (e.g., U cells (cell voltages), T cells (cell power levels), I pack (pack current), battery state (charging, discharging, rest, sleep, etc.), SOH (state of health (ratio of current capacity to nominal capacity)), SOC (state of charge (similar fuel gauge, shows remaining charge in battery)), error levels (error levels in cell voltages and cell power levels)), and individual super-cell currents calculated by the current assessor 1006. The charging policy may be output by the SOP application to the external charger 1008 to control the charging of a battery pack associated with the vehicle 117.

One or more edge monitoring models 1010 (also referred to as edge lithium plating monitoring models herein and depicted as "LiP Monitoring" in FIG. 10) may be implemented in computer instructions stored on one or more memory devices and executed by one or more processing devices. The one or more edge monitoring models 1010 may detect a likelihood of occurrence of lithium plating based on an anode potential of the battery pack, as described further herein. The neural anode potential model 1004 may continuously or continually learn (or be trained) from data associated with fleet vehicles (e.g., multiple vehicles), and the neural anode potential model's 1004 prediction may become more accurate over time.

In some embodiments, if lithium plating is detected by the one or more edge monitoring models 1010, an anode potential offset may be dynamically adjusted within an anode potential offset window by an adaptive charge manager application 1012 to modify the charging policy to be more conservative (e g., reduce current and/or voltage) to slow down charging to prevent or reduce further lithium plating.

Relevant data (e.g., cell voltages, currents, temperatures, modified anode potential offset, and lithium plating information) about lithium plating detection at the edge may be transmitted to the cloud-based computing system 116 by the adaptive charge manager 1012. Even without a full cell tear-down, this data empowers continuous learning and improvement of the system. For example, one or more cloud prediction models 1014 (also referred to herein as cloud lithium plating prediction models, prediction models, and depicted as "LiP Predictor") may be trained based on historical operation and detection results from the one or more edge monitoring models 1010 for an entire fleet of vehicles 1022 being monitored (depicted as "Fleet Monitoring" 1024, which may be implemented in computer instructions stored on one more memory devices and executed by one or processing devices) The fleet monitoring application 1024 may store historical fleet data in a database 1026, and this data may be used for training one or more monitoring and/or prediction models. The one or more cloud prediction models 1014 may be implemented in computer instructions stored on one or more memory devices and executed by one or more processing devices. Once the one or more cloud prediction models 1014 are deployed at the cloud-based computing system 116, the one or more cloud prediction models 1014 proactively predict a likelihood of occurrence of lithium plating (e.g., a probability, a percentage chance, etc.) even, in some instances, before lithium happens. The one or more cloud prediction models 1014 may predict the likelihood of occurrence for each vehicle in an entire fleet of vehicles, which may enable each respective adaptive charge manager application 1002 to adjust the anode potential offset even before lithium plating becomes more pronounced, aiming for minimal lithium plating across the fleet. The loop of anode potential adjustment by the adaptive charge manager application 1002 based on lithium plating monitoring and lithium plating prediction results may continuously or continually become more efficient and accurate.

In some instances, where the adjusted charging policy by the adaptive charge manager application 1012 does not prevent severe lithium plating and anode potential offsets reach a maximum value, a deeper investigation may be employed. For example, the vehicle with detected lithium plating may be recalled for a detailed cell tear-down (depicted as "Recall Tear Down" 1018). This means that anode potential offset has reached an upper threshold of an intended window (e.g., between −5 millivolt and +15 millivolt range) and there are no further anode potential offset increase left to apply. Logistics of a battery recall have multiple options, such as replacing the battery and returning the vehicle to its owner or providing a replacement vehicle and it depends on the choices made by manufacturers and fleet operators. Tear-down operations may conclusively reveal lithium plating occurrence and severity. Cell tear-down may provide invaluable insights into the specific causes of lithium plating in that particular case.

In some embodiments, the tear-down data may be used to retrain the one or more edge monitoring models 1010 (depicted as "Retrain LiP Monitor" 1016) and/or the one or more cloud prediction models 1014 (depicted as "Retrain LiP Predictor" 1020). That is, the tear-down data may fuel the development of even more accurate lithium plating prediction and monitoring models. These models, trained on both fleet data and specific tear-down insights, can predict potential lithium plating risks much earlier, allowing preemptive adjustments to the charging policy before any lithium plating may occur. In the case of lithium plating monitoring, cell tear-downs may reduce false positives and false negatives and retrained edge monitoring models 1010 may be updated by an OTA (over-the-air) update from the cloud-based computing system 116 for the entire fleet. Whereas lithium plating prediction functionality resides in the cloud-based computing system 116 and may trigger pre-emptive anode potential offset change by reporting predictions to the adaptive charge manager application 1012 in the edge.

In some embodiments, the system may operate in a continuous feedback loop of learning and adaptation. By starting with an adaptable initial deployment, the system may dynamically respond to real-world data and build increasingly accurate monitoring and prediction models. This may ultimately allow achieving a goal of safe and efficient fast charging for lithium-ion batteries, minimizing lithium plating and maximizing fleet health.

With regard to the one or more edge monitoring models 1010, sensor measurements on current, voltage, and temperature of the battery pack may be obtained periodically at the edge vehicle 117. One or more edge processors may profile the sensors data and perform Fast Fourier Transform using the data to extract features of the measured data. In some embodiments, the one or more edge processors may apply mean comparison to the features extracted One or more trained machine learning models may classify divergences in the data by comparing it to other cell data from other battery packs. If the divergence is sufficiently large (e.g., more than a threshold condition), then the detection result may be transmitted to the adaptive charge manager 1012, which may calculate new anode potential offset to create more conservative (e.g., lower current, lower voltage to be used to charge the battery slower) charging policies.

In some embodiments, a role of the lithium plating edge monitoring models may be to function as a watchdog to monitor potential modeling errors of anode potential-based charging logic. Using an accurate model, since fast charging policy may be designed to keep anode potential above 0 V, formation of lithium plating is less likely. The one or more lithium plating edge monitoring models 1010 may detect lithium plating and transmit the likelihood of occurrence of lithium plating to the adaptive charge manager 1012, which may modify the anode potential offset.

With regard to the one or more lithium plating cloud prediction models 1014, these models 1014 may be trained and deployed at the cloud-based computing system 116 to enable pre-emptive anode potential offset adjustments to increase fleet-level battery pack life duration. The training dataset may be generated directly from field data related to fleet vehicle battery packs and lithium plating and by considering the lithium plating monitoring detection results as labels and complete battery pack history being used to make predictions for subsequently received battery pack data. In some embodiments, the one or more cloud prediction models 1014 may rely on historical data and may leverage the computing power provided by the cloud-based computing system 116.

In some embodiments, if lithium plating does not stop and continues to form and the adaptive charge manager 1012 reaches a maximum anode potential offset, the vehicle and/or the battery pack may be recalled so cell tear-down may be organized. The cloud-based computing system 116 may consider cell tear-down data which provides accurate information about lithium plating status of the complete fleet battery packs. The generated training tear-down dataset may be generated and used to train the lithium plating edge monitoring models 1010 and the cloud prediction models 1014. In some embodiments, the one or more edge monitoring models 1010 may be a classifier using one or more machine learning models. In some embodiments, the one or more cloud prediction models 1014 may include one or more machine learning regression models and the complete history of the fleet battery packs is used to make the prediction, whereas the one or more edge monitoring models may consider a last relevant event (charge/discharge).

Figure 11:
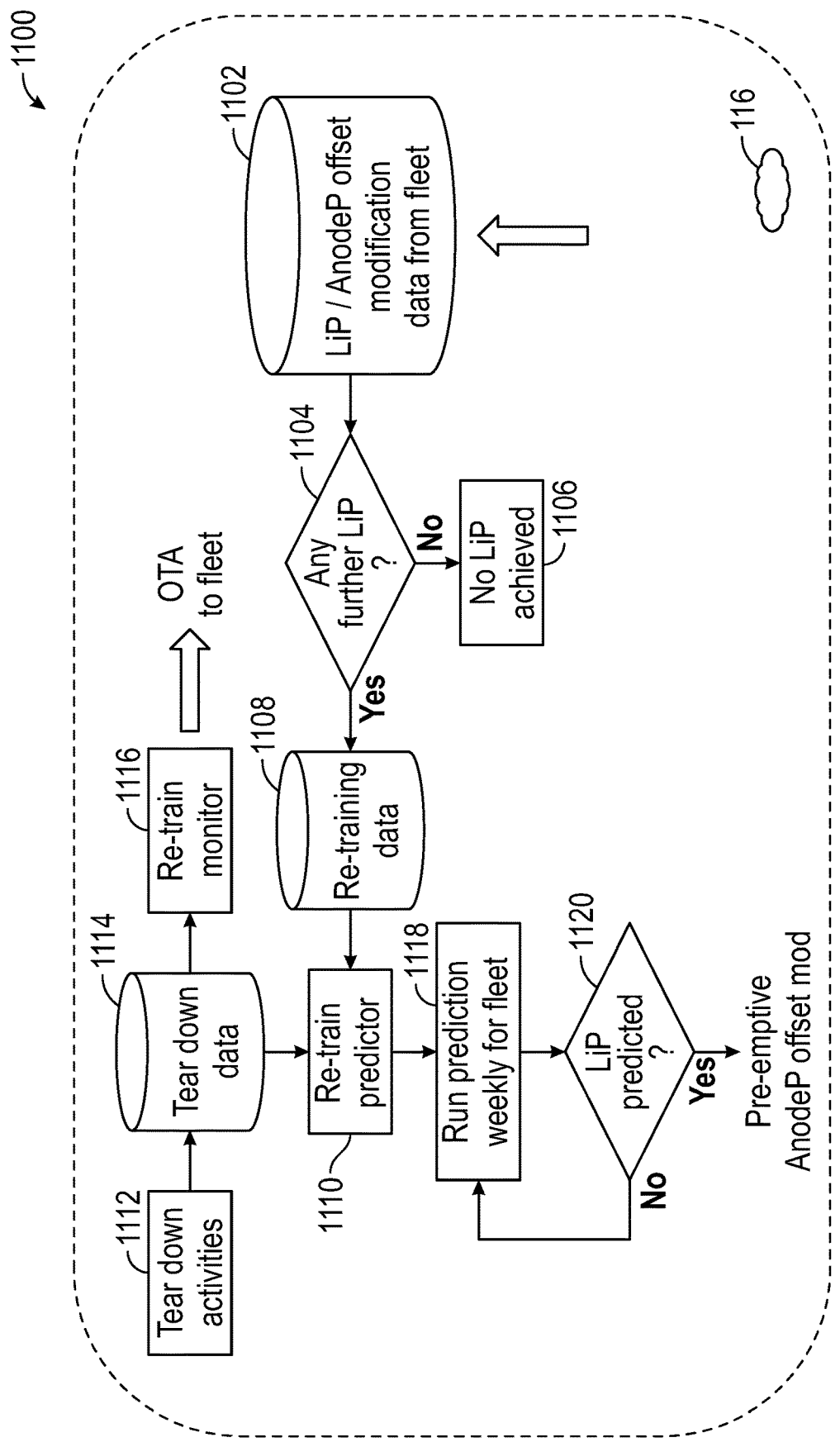
FIG. 11 illustrates an example flow chart for retraining one or more cloud lithium plating prediction models based on teardown data and/or anode potential offset modifications according to certain embodiments of this disclosure.
Figure 12:
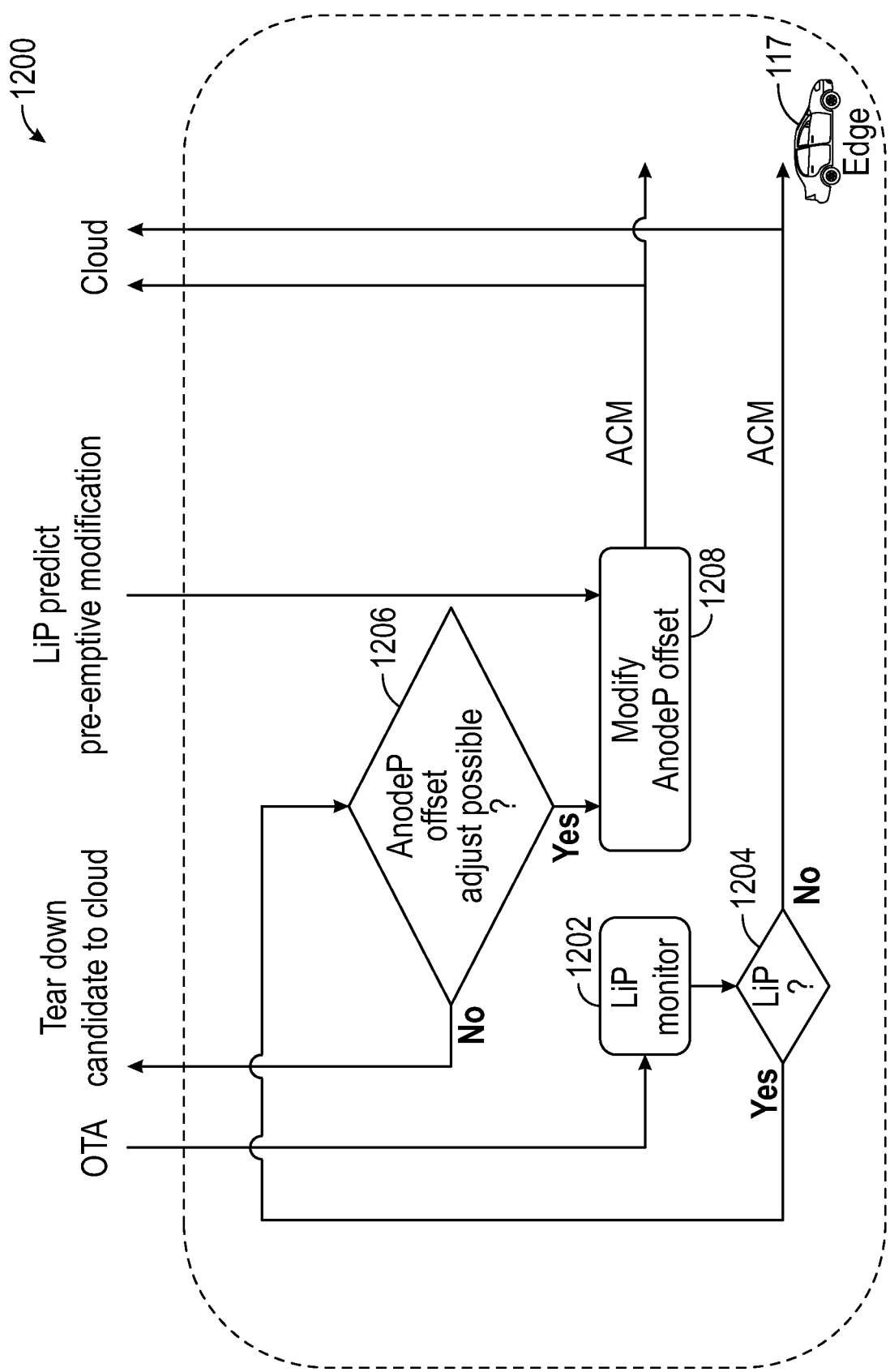
FIG. 12 illustrates an example flow chart using one or more edge monitoring models to detect lithium plating and modify an anode potential offset by changing a charging policy for a battery pack according to certain embodiments of this disclosure.

FIG. 11 illustrates an example flow chart 1100 for retraining one or more cloud lithium plating prediction models based on teardown data and/or anode potential offset modifications according to certain embodiments of this disclosure. FIG. 12 illustrates an example flow chart 1200 using one or more edge monitoring models to detect lithium plating and modify an anode potential offset by changing a charging policy for a battery pack according to certain embodiments of this disclosure;

FIG. 11 and FIG. 12 include one or more steps, functions, routines, etc. that may be implemented in computer instructions as part of an application and/or model (e.g., edge monitoring models, cloud prediction models, neural anode potential model, etc.) that are stored on one or more memory devices and executed by one or more processing devices of the cloud-based computing system 116 and/or the vehicle 117. As depicted in the flow chart 1200 of FIG. 12, occurrence of lithium plating may be continuously monitored at 1202. If lithium plating is detected at 1204, a determination is made at 1206 if anode potential offset can be made or whether the anode potential has exceeded a threshold condition. If the adjustment can be made, then at 1208, the anode potential offset is adjusted in line with predetermined steps. When anode potential offset cannot be adjusted any more, the cloud-based computing system 116 may be notified, via a notification, about the vehicle 117 as a tear-down candidate.

Tear-down candidates are recalled for tear-down to provide data on lithium plating status and severity. The cloud-based computing system 116 may use historical data as it collects all anode potential offset adjustments in a database 1102 (depicted as "LiP/AnodeP offset modification data from fleet") from individual edge vehicles for the entire fleet. Tear-down data together with historical anode potential offset adjustment data and pre-emptive anode potential offset changes data are used to re-train the one or more edge monitoring models and one or more cloud prediction models. One or more parameters associated with the one or more edge monitor models may be transmitted to each edge processor associated with each vehicle in the fleet over-the-air. The one or more cloud prediction models in the cloud-based computing system 116 and the one or more edge monitor models in the edge may become progressively more and more accurate in time in lithium plating prediction and pre-emptive adjustments.

The one or more cloud prediction models may execute regularly (e.g., daily, weekly, etc.) to preemptively adjust anode potential offsets for individual vehicles in a fleet. The cloud-based computing system 116 may store a copy of vehicle historical data for each vehicle in the fleet. In some embodiments, the cloud-based computing system 116 may only intervene when necessary for individual vehicles.

At 1104, the cloud-based computing system 116 may determine whether there are any further lithium plating occurrences detected by the fleet's edge monitoring models. If not, then the cloud-based system may determine, at 1106, that no lithium plating is achieved (depicted as "No LiP Achieved"). If there are additional lithium plating occurrences detected, then data associated with those occurrences may be stored in a database 1108 (depicted as "Re-training data") and used for retraining. Further, the cloud-based computing system 116 may perform one or more tear-down activities (e.g., recall vehicle, take lithium plated suspected battery our, inspect battery using an electron microscope, existence and severity of lithium plating occurrence, compare this with predicted lithium plating and decide to retrain all machine learning models or not) at 1112. The tear-down data may include peripheral data such as how fast the batter was charged, at what temperature the battery was charged, etc. The tear-down data obtained from the tear-down activities may be stored in a database 1114 (depicted as "Tear Down Data"). At 1110, the tear-down data may be used, along with the data associated with the lithium plating occurrences, to retrain the one or more cloud prediction models at 1118. At 1118, the cloud-based computing system 116 may execute the one or more cloud prediction models and, at 1120, a determination may be made whether lithium plating is predicted. If not, the cloud-based computing system 116 may execute the one or more cloud prediction models again at 1118. If lithium plating is predicted, then the cloud-based computing system 116 may preemptively modify the anode potential offset by transmitting a modified battery charging policy including values for current and/or voltages to be used to charge the battery pack.

Additionally, at 1116 retrain (depicted as "Re-train Monitor"), the tear-down data may be used to the one or more edge monitoring models by transmitting one or more parameters associated with the tear-down data over the air (e.g., via the network 112) to the entire fleet. The one or more parameters may be associated with any aspect of a machine learning model, such as a number of layers to implement, an activation function to use, one or more weights to use at each node, a number of nodes to include in each layer, a number of hidden layers to employ, and the like.

Figure 13:
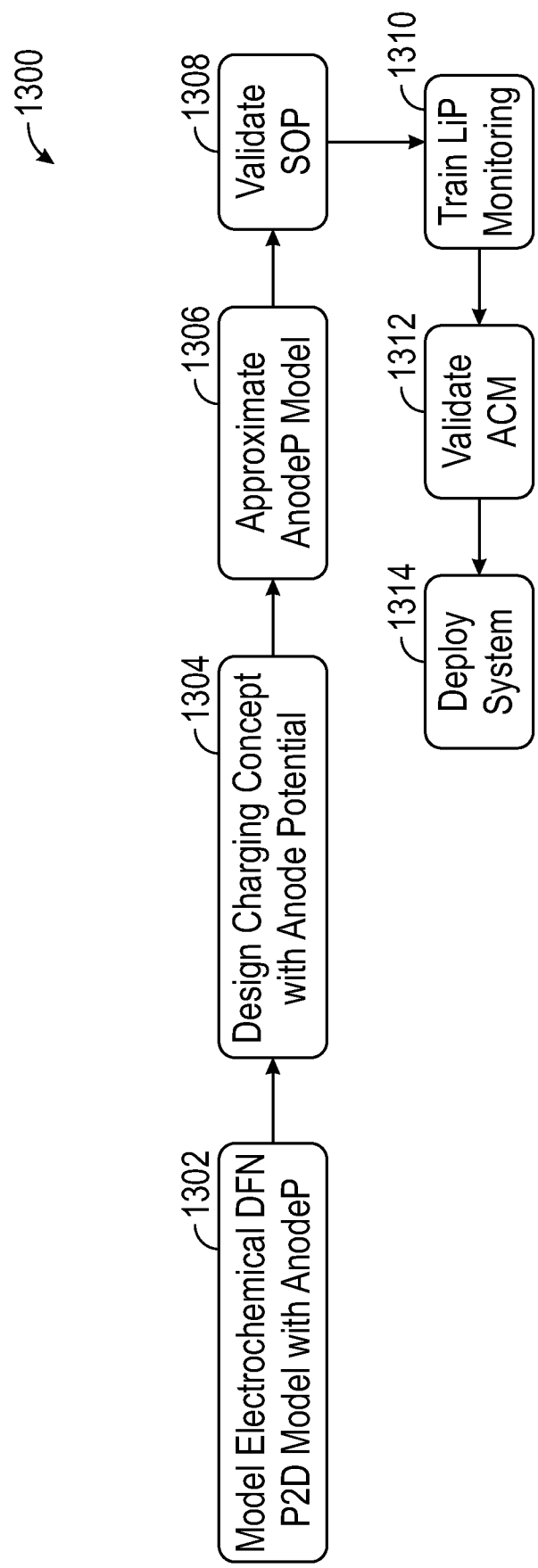
FIG. 13 illustrates example pre-deployment activities for the techniques according to certain embodiments of this disclosure.

FIG. 13 illustrates example pre-deployment operations 1300 for the techniques according to certain embodiments of this disclosure. These operations may be performed once to develop, test, and tune the system for a particular battery type and chemistry Following pre-deployment tuning, the software may update itself based on the field events for each vehicle depending on the lithium plating formation. As time goes by, the system may become incrementally more accurate, which may significantly reduce, possibly eradicate lithium plating. The operations or steps 1302, 1304, 1306, 1308, 1310, 1312, and/or 1314 may be implemented in computer instructions stored on one or more memory devices and executed by one or more processing devices.

At 1302, one or more processing devices may generate one or more pseudo two-dimensional (P2D) electrochemical battery models and/or Doyle Fuller Newman (DFN) electrochemical battery models. These high fidelity electrochemical models may be developed for the target cell by analyzing and processing cell tear-down data to capture cell geometry, material properties, and the like. The high fidelity P2D and/or DEN electrochemical battery models may be trained and/or programmed to receive current as input and may output a determined or calculated voltage and also unmeasurable quantities, such as electrode potentials and lithium flux. Training data may be used to train the P2D and/or DFN electrochemical battery models and the training data may include labeled inputs (e.g., current) mapped to labeled outputs (e.g., electrode potentials, lithium flux).

At 1304, one or more processing devices may configure battery charging policy generation by setting certain constraints. The configuration may specify designing charging to minimize an amount of time it takes to charge a battery without violating anode potential and/or over/under voltage limits.

At 1306, one or more processing devices may approximate an anode potential by determined by the neural anode potential model to integrate a battery charging algorithm (executed by the state of power application) that utilizes anode potential on the battery management system hardware. The neural anode potential model may consume processing power than the P2D/DFN electrochemical model, thereby saving computer resources. The neural anode potential model and/or the state of power application may be transmitted to one or more edge processors associated with one or more vehicles in the fleet. For example, one or more executable computer applications implemented in computer instructions that run the neural anode potential model and/or the state of power application may be transmitted via the network 112 from the cloud-based computing system 116 to the one or more edge processors at the vehicles.

At 1308, one or more processing devices may integrate the neural anode potential model and the state of power application such that the output from the neural anode potential model is input into the state of power application and/or the adaptive charge manager. The adaptive charge manager may be implemented in computer instructions stored on one or more memory devices and executed by one or more processing devices. The one or more processing devices may test the charging policy within the battery management system hardware after the neural anode potential model and the state of power application are integrated.

At 1310, one or more processing devices (e.g., at the cloud-based computing system 116 and/or the vehicle 117) may train the one or more edge monitoring models 1010 The one or more edge monitoring models 1010 may be one or more machine learning models. The machine learning models of the edge monitoring models 1010 may be trained using training data including labeled inputs (e.g., battery current, voltage, temperature) mapped to labeled outputs (e.g., a likelihood of occurrence (probability) of lithium plating). In some embodiments, a replicate monitoring model may be trained in the cloud and the parameters of the replicate monitoring model may be transmitted to the edge to train the edge monitoring models 1010.

At 1312, one or more processing devices (e.g., at the cloud-based computing system 116 and/or the vehicle 117) may configure and tune the calculation logic (implemented in computer instructions stored on one or more memory devices and executed by one or more processing devices) of the adaptive charge manager by integrating the adaptive charge manager, the one or more edge monitoring models, the neural anode potential model, the state of power application, and/or the cell current assessor (implemented in computer instructions stored on one or more memory devices and executed by one or more processing devices). In some embodiments, the one or more edge processors may run a design-of-experiment to create baseline correlations to configure a size of the anode potential offset and its influence on the charging time and how it mitigates lithium plating in consecutive fast charging tests. In some embodiments, the design-of-experiment correlations may be used to generate a lookup table. The calculation logic may include a lookup table that includes anode potential offset, lithium plating probability, current anode potential offset, target anode potential offset (e.g. −5 millivolts to +20 millivolts).

At 1314, the system may be deployed at one or more edge processors to receive inputs from one or more sensors (e.g., current, voltage, temperature) associated with one or more battery packs at one or more vehicles of a fleet. Further, the vehicles may include network interface cards communicatively coupled to the edge processors such that the edge processors are able to communicate via the network 112 with the cloud-based computing system 116 Such a technique may enable the edge processors to transmit data and/or notifications to the cloud-based computing system 116 and to receive data and/or notifications and/or control signals from the cloud-based computing system 116.

Figure 14:
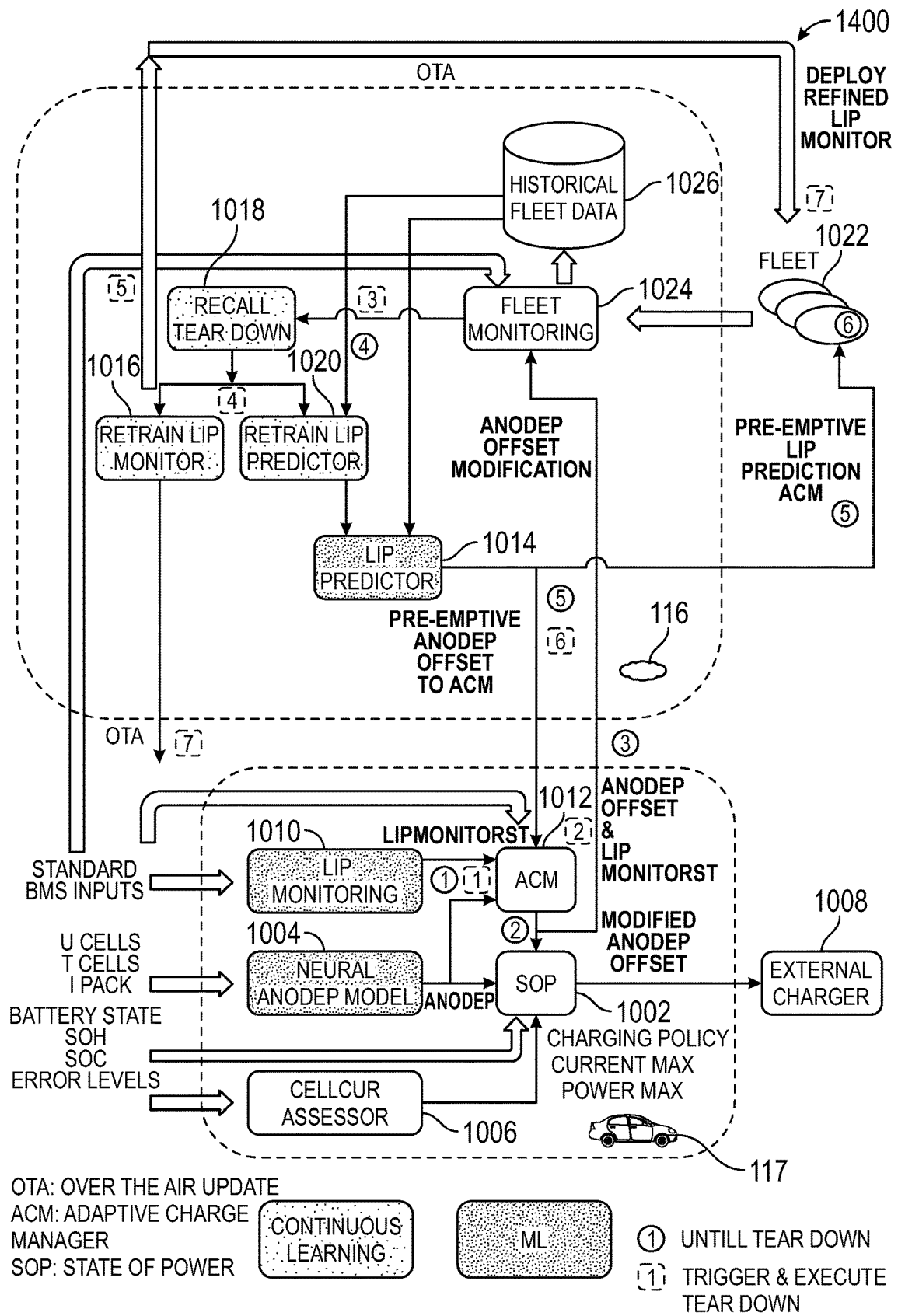
FIG. 14 illustrates another example architecture for lithium plating prediction and adaptive battery charging according to certain embodiments of this disclosure.

FIG. 14 illustrates another example architecture 1400 for lithium plating prediction and adaptive battery charging according to certain embodiments of this disclosure.

For an initial deployment of the system, this paragraph focuses on a sequence of events represented by the white circled numbers (WCN), for example WCN 1, WCN 2, WCN 3, WCN 4, WCN 5, and WCN 6. In some embodiments, an anode potential based fast charging policy may be deployed as part of the state of power application and may operate based on the cell current assessor and other battery management system inputs. The order of events for the anode potential offset and learning begin with WCN 1. At WCN 1, lithium plating is detected by the one or more edge monitoring models 1010. At WCN 2, the anode potential offset is adjusted by the adaptive charge manager 1012 and sent to the state of power application 1002. At WCN 3, the lithium plating detection result and new anode potential offset is transmitted to the cloud-based computing system with the battery management system inputs. At WCN 4, the one or more cloud prediction models 1014 may be trained to enable preemptively determine anode potential offset and may be deployed to the cloud-based computing system 116. The one or more cloud prediction models 1014 are trained to predict the likelihood of occurrence of lithium plating based on historical data. At WCN 5, once deployed, the one or more cloud prediction models 1014 may output a likelihood of occurrence and if the likelihood of occurrence is above a threshold condition, then the anode potential offset may be transmitted to the adaptive charge manager 1012. At WCN 6, if there is a risk of lithium plating with the charging policy being used, the anode potential offset may be modified even before lithium plating occurs for each vehicle in the fleet.

In instances where the anode potential offset reaches a maximum limit due to multiple adjustments by the consecutive lithium plating detections, the adaptive charge manager 1012 may transmit a notification to the cloud-based computing system 116 to initiate recall and tear-down. Cell tear-downs may generate comprehensive lithium plating information to refine and retrain lithium plating monitoring models and prediction models, which may prevent lithium plating from occurring on other battery packs. this paragraph focuses on a sequence of events represented by the grey shaded square numbers (GSSN), for example GSSN 1, GSSN 2, GSSN 3, GSSN 4, GSSN 5, GSSN 6, and GSSN 7. The order of events for the lithium plating detection/prediction that leads to recall/tear-down begin with GSSN 1. At GSSN 1, the one or more edge monitoring models 1010 detect lithium plating on new cells in the battery pack. At GSSN 2, the adaptive charge manager 1012 determines that the maximum anode potential offset level has been reached. Thus, the adaptive charge manager 1012 may transmit a notification of this to the cloud-based computing system 116 that is monitoring the fleet. At GSSN 3, the cloud-based computing device 116 may receive the notification and organize battery pack recall and cell tear-down activities. At GSSN 4, the one or more lithium plating edge monitoring models 1010 and cloud prediction models 1014 are retrained based on insights (tear-down data) generated from the recent tear-down activities. At GSSN 5, the retrained lithium plating edge monitoring model parameters are transmitted over the air via the network 112 to the edge monitoring models 1010 for each vehicle in the fleet. At GSSN 6, one or more retrained lithium plating cloud prediction models 1014 are deployed at the cloud-based computing system 116 to make more accurate lithium plating predictions that enable preemptive anode potential offset modifications. At GSSN 7, the adaptive charge manager 1012 may make anode potential offset adjustments based on inputs received from the one or more cloud prediction models 1014.

Figure 15:
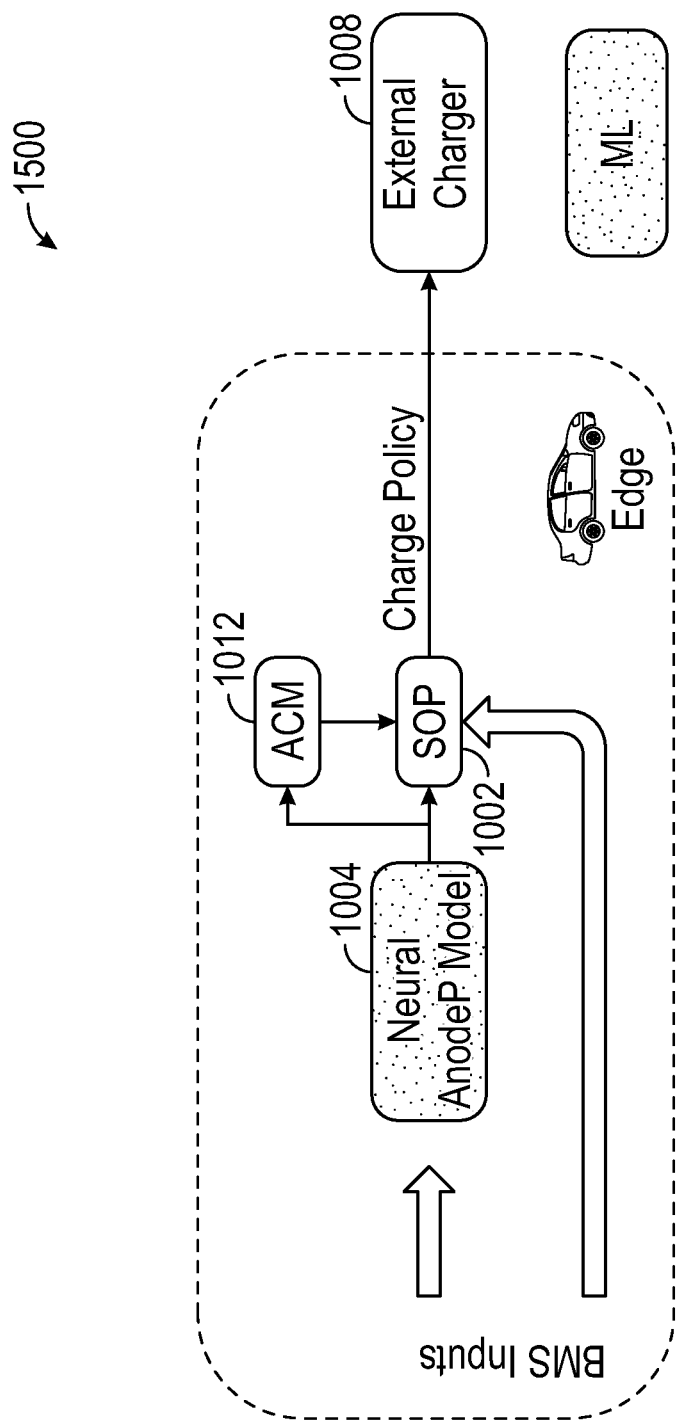
FIG. 15 illustrates an example flow chart for an anode potential neural approximator according to certain embodiments of this disclosure.

FIG. 15 illustrates an example flow chart 1500 for an anode potential neural approximator according to certain embodiments of this disclosure. In some embodiments, anode potential-based charging may directly monitor the negative electrode (anode) potential during charging. Lithium plating occurs when the anode potential falls below a specific threshold, causing lithium ions to deposit as metallic lithium on the electrode surface. By carefully controlling the charging current and voltage based on the measured anode potential, in some embodiments, lithium plating may be avoided.

In some embodiments, the disclosed hybrid system offers a technical solution for accurate and real-time anode potential monitoring without requiring invasive sensors. The initial system builds upon a detailed pseudo-two-dimensional (P2D) electrochemical model, as discussed herein. This model, often established through extensive cell tear-downs and lab experiments, captures the intricate dynamics of the battery, including the anode potential behavior. The P2D electrochemical model may provide accurate physics-based prediction of anode potential under various operating conditions. To enable real-time monitoring, a lightweight neural network (NN) is trained on the anode potential output using the P2D electrochemical model. This NN acts as a surrogate model, learning the complex relationship between battery inputs (current, temperature, etc.) and the corresponding anode potential output. The NN, which may be significantly less computationally demanding than the P2D electrochemical model, may be seamlessly integrated into the battery management system (BMS) of an electric vehicle at the edge. A neural anode potential model 1004 may have inputs as cell voltages, power levels, currents of battery packs and it outputs anode potential that is being utilized by the adaptive charge manager 1012 and state of power application 1002. Instead of using machine learning, in some embodiments, neural anode potential model 1004 may be integrated to the BMS hardware by other techniques such as model order reduction (lumping parameters, asymptotic methods) or using lower fidelity models such as single particle model with electrolyte.

Figure 16:
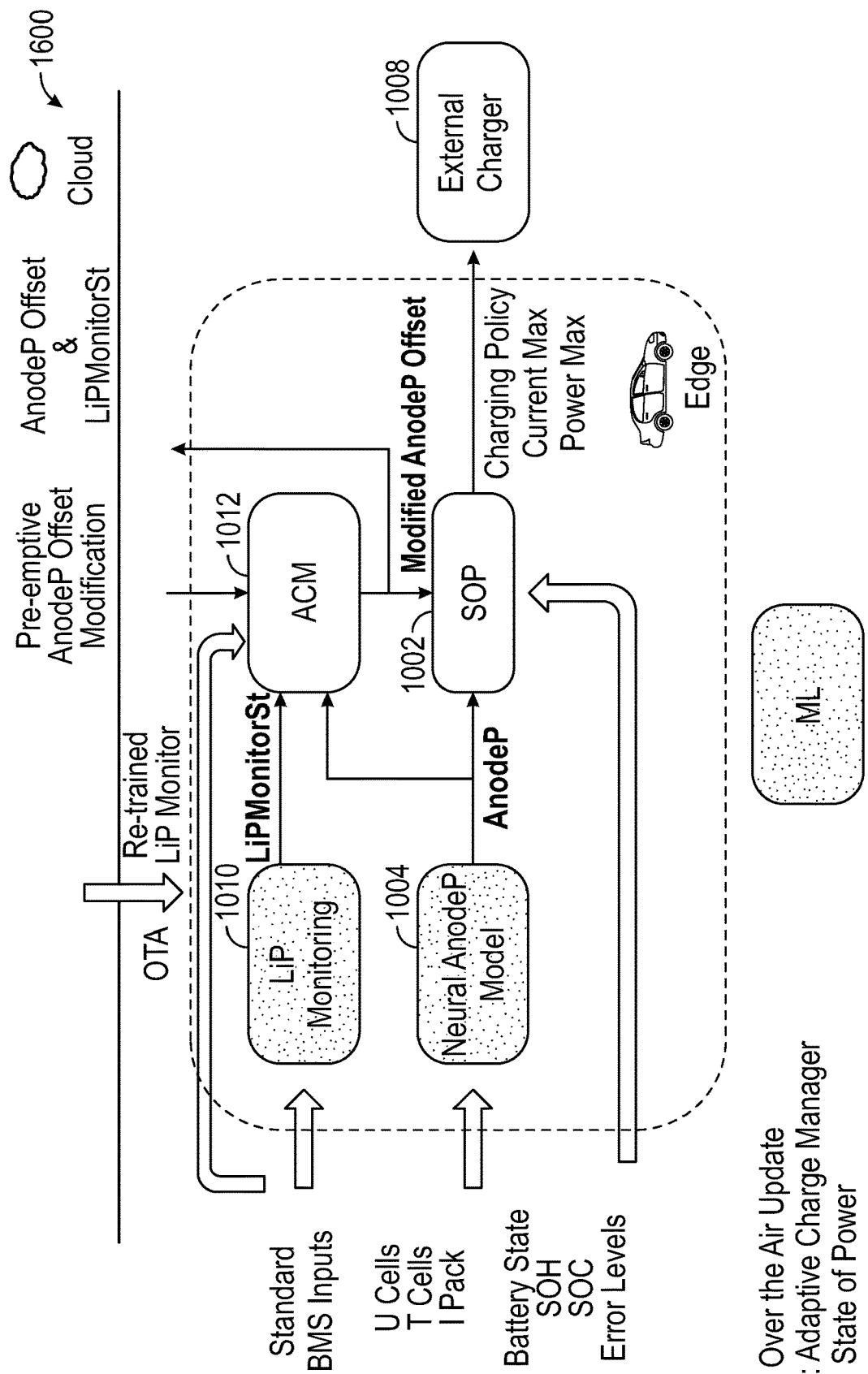
FIG. 16 illustrates an example flow chart for using an adaptive charge manager to modify a charging policy based on predicted lithium plating occurrence according to certain embodiments of this disclosure.

FIG. 16 illustrates an example flow chart 1600 for using an adaptive charge manager 1012 to modify a charging policy based on predicted lithium plating occurrence according to certain embodiments of this disclosure.

The adaptive charge manager 1012 combines lithium plating detection provided by the one or more edge monitoring models 1010 with the adjustment of the charging policy of the state of power application 1002. In some embodiments, the anode potential offset may be modified by the adaptive charge manager 1012 within a predefined window with predetermined steps. The anode potential window may be designed by simulation driven activities with the high-fidelity P2D electrochemical model and validated in battery pack testing labs. During the fast-charging anode potential should not drop below 0 volts. Due to measurement noise and modeling errors, in some embodiments, a safety offset may be added to the anode potential and dynamically adjust this value based on lithium plating monitoring and prediction outputs. In some embodiments, one or more processors may determine the levels based-on simulation and lab testing. The adaptive charge manager 1012 may receive the inputs: lithium plating monitoring/ prediction results, battery pack current, cell voltages and temperatures, SOH, SOC and battery-state.

In the instance where lithium plating is detected by the one or more edge monitoring models 1010 and/or predicted by the one or more cloud prediction models 1014, the adaptive charge manager 1012 may determine the next anode potential offset and transmits this to the state of power application 1002, which is the responsible to adjust charging policy accordingly. Since, increased anode potential offset may slow down the charging by increasing the total charge time, there is a maximum value for anode potential offset. If anode potential offset value has reached a maximum, despite lithium plating detections, the adaptive charge manager 1012 communicates this information to the cloud-based computing system 116 to trigger battery pack/vehicle recall and cell tear-down. In some embodiments, the adaptive charge manager 1012 may use a lookup table to identify the anode potential offset to be achieved and the current and voltages that enable the anode potential offset. Besides pre-defined look-up tables, adaptive charge manager 1012 may be designed by other methods such as deep reinforcement learning. In some embodiments, the same adaptation may also be performed in other ways than an offset, for example a risk factor for lithium plating with the severity of existing or potential plating or any other method that allows adaptation of an anode potential limitation to consider reducing and/or slowing down.

Figure 17:
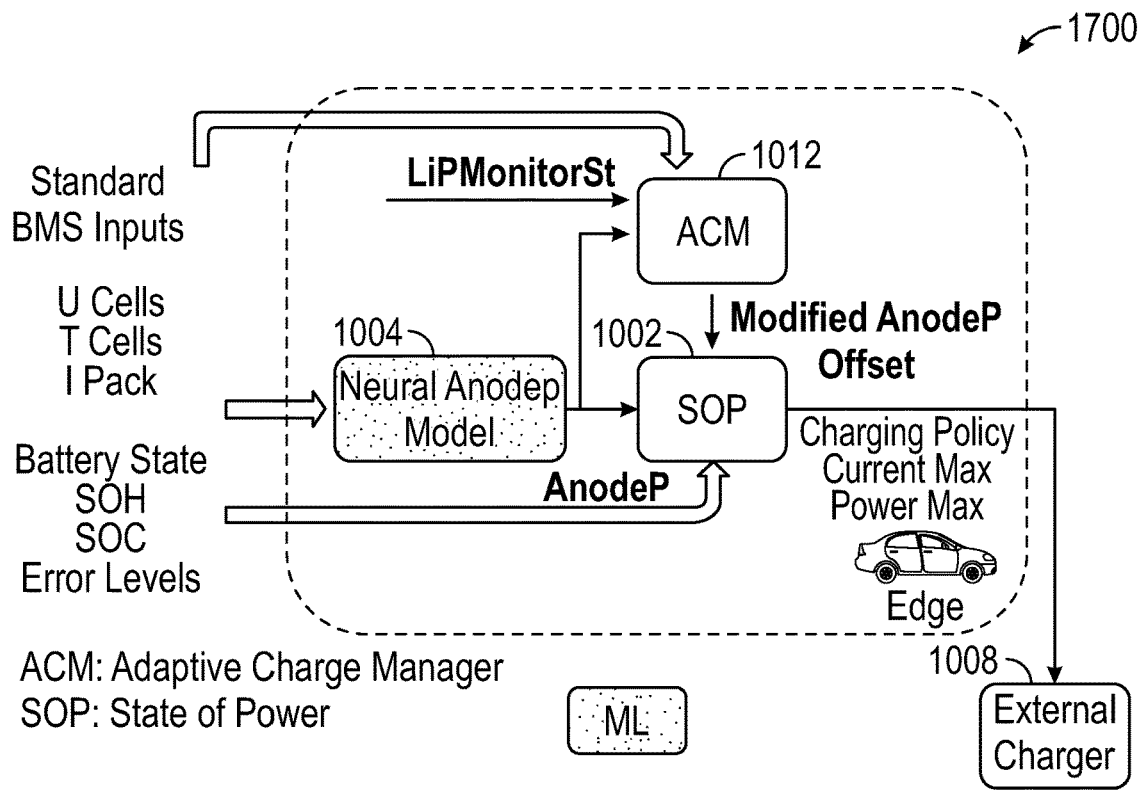
FIG. 17 illustrates an example flow chart for using a state of power application according to certain embodiments of this disclosure.

FIG. 17 illustrates an example flow chart 1700 for using a state of power application 1002 according to certain embodiments of this disclosure. The state of power application 1002 may determine and publish available charge. The state of power application 1002 may publish discharge power (or current/voltage) limits (e.g. instantaneous and/or peak) with one or more defined time horizon(s) such as 2 seconds, 10 seconds, 30 seconds, 60 seconds, etc.) to enhance performance, availability, and lifetime of a battery pack. These calculations may be based on current operating conditions such as ambient/battery temperature(s), state of charge (SOC), voltage and temperature of the cells and/or battery pack, C-rate/pack current, safety limits on these current operating conditions (upper and lower limits on cell/pack voltage, temperatures, pack current and cell/pack SOC) recent or predicted battery pack current/power, state of the battery pack (whether it is charging, discharging/use or in a "sleep" i.e., inactive, mode), any existing or potential battery errors and faults etc.

The state of power application 1002 may implement the charging policy of a battery pack by publishing the relevant charge power (or current/voltage) limits to one or more charge controllers of an external charger 1008. In some embodiments, the state of power application 1002 may receive an additional input from the adaptive charge manager 1012 to maintain anode potential above 0 Volt for each cell. This input may be an offset/safety margin to the anode potential lower limit to reduce the risk of lithium plating.

In some embodiments, the state of power application 1002 may calculate anode potential offset by using a non-linear function which maps input signals (current operating conditions such as ambient/battery temperature(s), state of charge (SOC), voltage and temperature of the cells and/or battery pack, C-rate/pack current, safety limits on these current operating conditions (upper and lower limits on cell/pack voltage, temperatures, pack current and cell/pack SOC) recent or predicted battery pack current/power, state of the battery pack (whether it is charging, discharging/use or in a "sleep" i.e., inactive, mode), any existing or potential battery errors and faults etc.) to the available instantaneous power over the defined horizon(s). Various methods may be used to implement this function such as constrained (with hard or soft constraints) optimization, optimal control Linear Quadratic Regulator (LQR), Linear Quadratic Gain (LQG), Generalized Predictive Control (GPC), Dynamic Matrix Control (DMC), Model Predictive Control (MPC) (with hard or soft constraints, nonlinear, linearized or linear, robust, implemented as a version of a quadratic program), Internal Model Control (IMC), various flavors of proportional-integral-derivative (PID) Control, Bisection search in combination with the model of battery, Reinforcement Learning (RL), Model Based (Deep), and the like.

Figure 18:
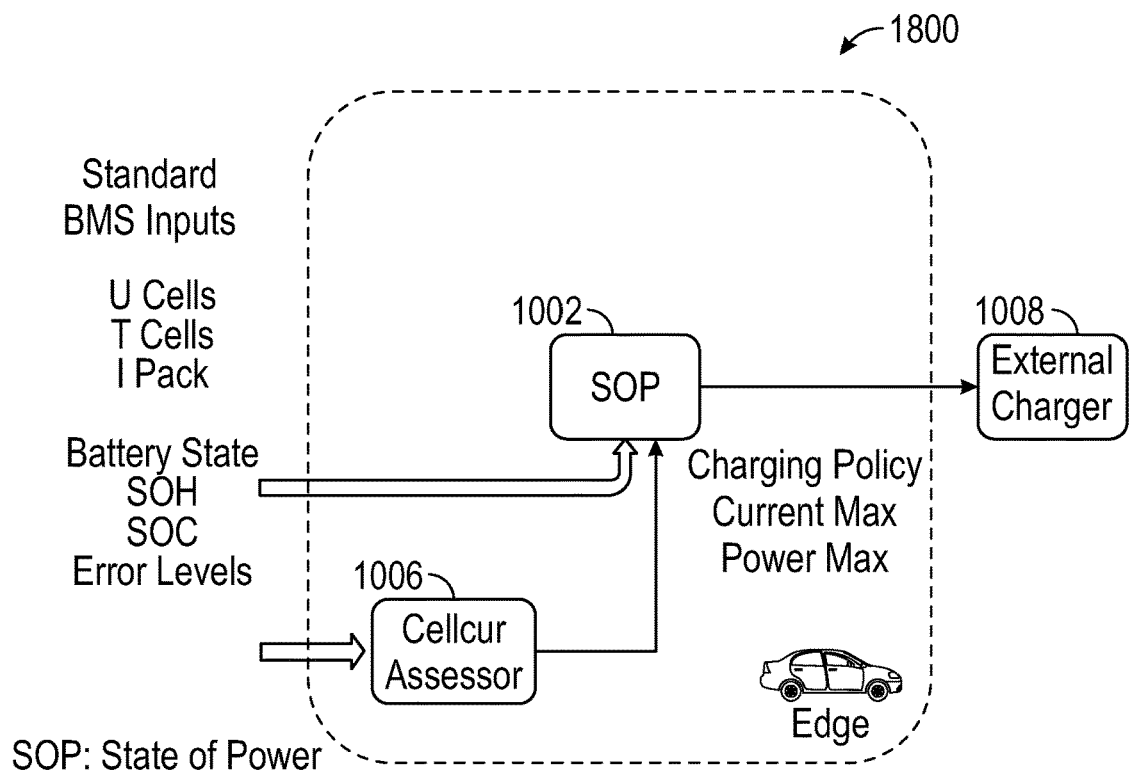
FIG. 18 illustrates an example flow chart for using a cell current assessor according to certain embodiments of this disclosure.

FIG. 18 illustrates an example flow chart 1800 for using a cell current assessor 1006 according to certain embodiments of this disclosure. The cell current assessor may be implemented in computer instructions stored on one or more memory devices and executed by one or more processing devices. Inputs to the cell current assessor 1006 may be balancing state for each super-cell, pack current, etc. Outputs from the cell current assessor 1006 may be the current experienced by each cell in the pack. Parameters of the cell current assessor 1006 may be the configuration of the battery pack (e.g. how many cells in series and parallel are there), the connection and busbar resistances for the parallel connection of the cells, etc.

In some embodiments, when balancing is active, it introduces additional discharge (or charge-depending on the balancing system capability) current on top of the battery pack current. It may be taken into account when doing calculations to arrive at an accurate cell current, especially for low currents over long periods of time. Another effect that may be taken into account in packs when arriving at a cell current is the current distribution between parallel connected cells. Serially connected super-cells will experience identical current, however parallel connected cells will have deviations in the current they experience based on how they are connected together, (with busbars and welding or bolts etc.) in terms of additional resistance/voltage drops as dictated by Ohm's & Kirchoff's laws leading to differences in current, as well as their internal resistance deviations.

The state of power application 1002 may use information output by the cell current assessor 1006 to publish (e.g., transmit) maximum available current when charging.

Figure 19:
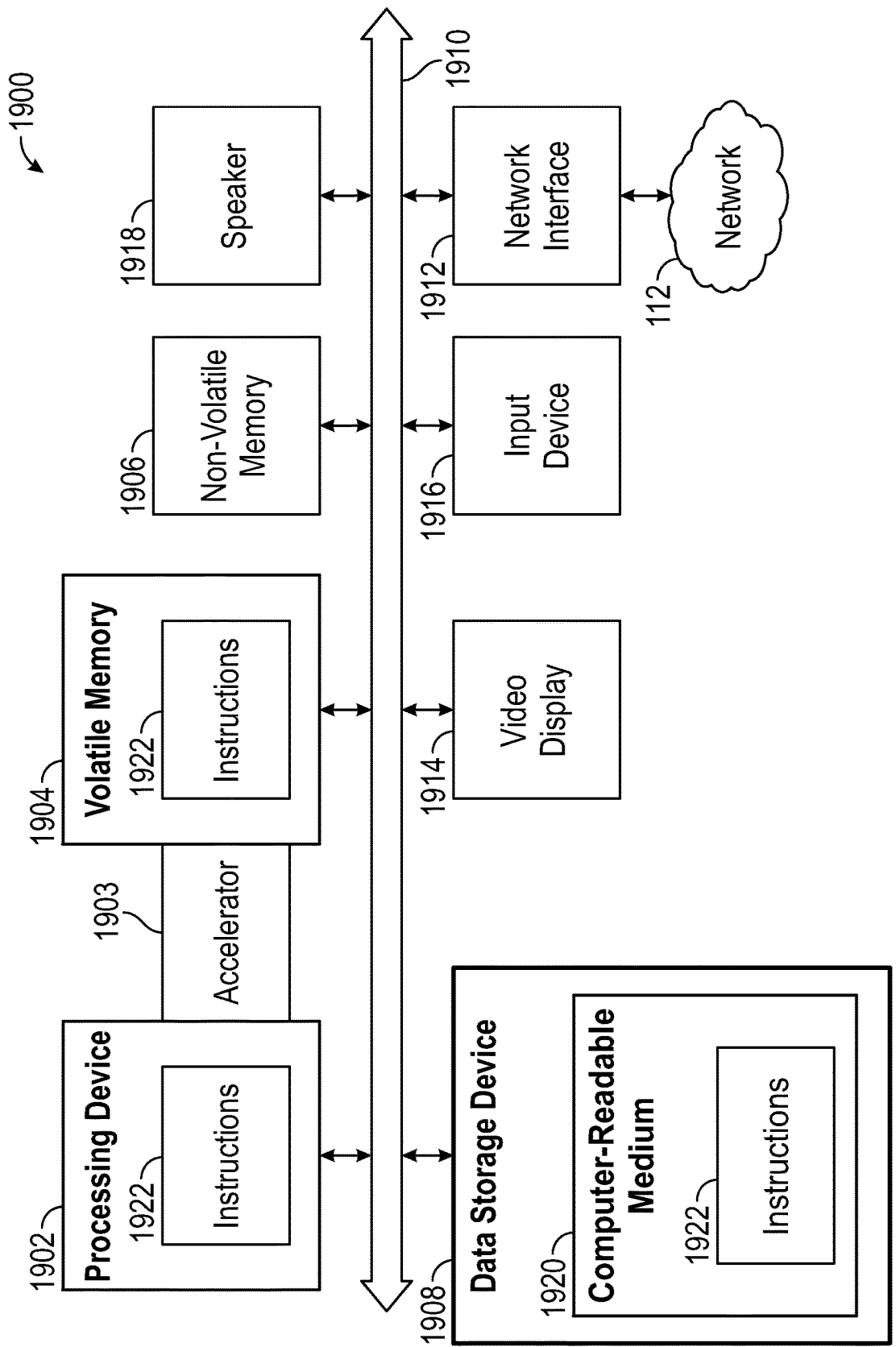
FIG. 19 illustrates an example computer system according to certain embodiments of this disclosure.

FIG. 19 illustrates example computer system 1800 which can perform any one or more of the methods described herein, in accordance with one or more aspects of the present disclosure. In one example, computer system 1800 may correspond to the computing device 102 (e.g., user computing device), one or more servers 128 of the cloud-based computing system 116, the training engine 130, any component of the vehicle 117, or any suitable component of FIG. 1. The computer system 1800 may be capable of executing the one or more machine learning models 132 of FIG. 1. The computer system may be connected (e.g., networked) to other computer systems in a LAN, an intranet, an extranet, or the Internet. The computer system may operate in the capacity of a server in a client-server network environment. The computer system may be a personal computer (PC), a tablet computer, a wearable (e.g., wristband), a set-top box (STB), a personal Digital Assistant (PDA), a mobile phone, a camera, a video camera, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The computer system 1800 includes a processing device 1802, a volatile memory 1804 (e.g., random access memory (RAM)), a non-volatile memory 1806 (e.g., read-only memory (ROM), flash memory, solid state drives (SSDs), and a data storage device 1808, the foregoing of which are enabled to communicate with each other via a bus 1810.

Processing device 1802 represents one or more general-purpose processing devices such as a microprocessor, central processing unit, or the like. More particularly, the processing device 1802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 1802 may also be one or more special-purpose processing devices such as an application specific integrated circuit (ASIC), a system on a chip, a field programmable gate array (FPGA), a digital signal processor (DSP), network processor, or the like. The processing device 1802 may include more than one processing device, and each of the processing devices may be the same or different types. The processing device 1802 may include or be communicatively coupled to one or more accelerators 1803 configured to offload various data-processing tasks from the processing device 1802. The processing device 1802 is configured to execute instructions for performing any of the operations and steps discussed herein.

The computer system 1800 may further include a network interface device 1812. The network interface device 1812 may be configured to communicate data via any suitable communication protocol. In some embodiments, the network interface devices 1812 may enable wireless (e.g., WiFi, Bluetooth, ZigBee, etc.) or wired (e.g., Ethernet, etc.) communications. The computer system 1800 also may include a video display 1814 (e.g., a liquid crystal display (LCD), a light-emitting diode (LED), an organic light-emitting diode (OLED), a quantum LED, a cathode ray tube (CRT), a shadow mask CRT, an aperture grille CRT, or a monochrome CRT), one or more input devices 1816 (e.g., a keyboard or a mouse), and one or more speakers 1818 (e.g., a speaker). In one illustrative example, the video display 1814 and the input device(s) 1816 may be combined into a single component or device (e.g., an LCD touch screen).

The output device 1850 may transmit and receive data from a computer system application programming interface (API). The data may pertain to any suitable information described herein, such as a remaining useful life of a battery pack, among other information.

The data storage device 1808 may include a computer-readable medium 1820 on which the instructions 1822 embodying any one or more of the methods, operations, or functions described herein is stored. The instructions 1822 may also reside, completely or at least partially, within the volatile memory 1804 or within the processing device 1802 during execution thereof by the computer system 1800. As such, the volatile memory 1804 and the processing device 1802 also constitute computer-readable media. The instructions 1822 may further be transmitted or received over a network via the network interface device 1812.

While the computer-readable storage medium 1820 is shown in the illustrative examples to be a single medium, the term "computer-readable storage medium" should be taken to include a single medium or multiple media (e.g., a centralized or distributed database, or associated caches and servers) that store the one or more sets of instructions. The term "computer-readable storage medium" shall also be taken to include any medium capable of storing, encoding, or carrying a set of instructions for execution by the machine, where such set of instructions cause the machine to perform any one or more of the methodologies of the present disclosure. The term "computer-readable storage medium" shall accordingly be taken to include, but not be limited to, solid-state memories, optical media, and magnetic media.

None of the description in this application should be read as implying that any particular element, step, or function is an essential element that must be included in the claim scope. The scope of patented subject matter is defined only by the claims. Moreover, none of the claims is intended to invoke 35 U.S.C. § 112 (f) unless the exact words "means for" are followed by a participle.

Consistent with the above disclosure, the examples of systems and method enumerated in the following clauses are specifically contemplated and are intended as a non-limiting set of examples.

1. A computer-implemented method comprising:
    while a battery pack is charging, predicting an anode potential of the battery pack;
    determining whether the anode potential satisfies a threshold condition;
    responsive to determining that the anode potential satisfies the threshold condition, modifying a charging policy of a battery pack to adjust an anode potential offset; and
    controlling, based on the charging policy, charging of the battery pack to adjust the anode potential offset.

2. The computer-implemented method of any clause herein, wherein the anode potential is predicted without using a sensor coupled to the battery pack.

3. The computer-implemented method of any clause herein, wherein the anode potential is predicted using a sensor coupled to the battery pack.

4. The computer-implemented method of any clause herein, wherein predicting the anode potential of the battery pack comprises:
    (i) using inputs pertaining to battery data to train a pseudo-two-dimensional physics-based model to output the predicted anode potential, wherein the battery data comprises current, temperature, or some combination thereof, and
    (ii) training a machine learning model using labeled data comprising the battery data as inputs and the predicted anode potential as outputs.

5. The computer-implemented method of any clause herein, wherein modifying the charging policy of the battery pack comprises determining a new anode potential offset to create a more conservative charging policy.

6. The computer-implemented method of any clause herein, further comprising using an edge processor to execute one or more trained machine learning models to predict the anode potential.

7. The computer-implemented method of any clause herein, further comprising using a cloud-based computing system to execute one or more trained machine learning models to predict the anode potential.

8. The computer-implemented method of any clause herein, wherein the charging policy comprises values for current, voltage, or both to be used to charge the battery pack.

9. The computer-implemented method of any clause herein, further comprising:

receiving, from a cloud-based computing system, one or more parameters pertaining to predicting the anode potential, wherein the one or more parameters are determined based on fleet vehicle historical data pertaining to anode potential of fleet battery packs;

retraining, at an edge processor, one or more machine learning models using the one or more parameters to predict the anode potential for subsequent charging cycles.

10. One or more tangible, non-transitory computer-readable media storing instructions that, when executed, cause one or more processing devices to:

while a battery pack is charging, predict an anode potential of the battery pack;

determine whether the anode potential satisfies a threshold condition;

responsive to determining that the anode potential satisfies the threshold condition, modify a charging policy of a battery pack to adjust an anode potential offset; and control, based on the charging policy, charging of the battery pack to adjust the anode potential offset.

11. The computer-readable media of any clause herein, wherein the anode potential is predicted without using a sensor coupled to the battery pack.

12. The computer-readable media of any clause herein, wherein the anode potential is predicted using a sensor coupled to the battery pack.

13. The computer-readable media of any clause herein, wherein predicting the anode potential of the battery pack comprises:
(i) using inputs pertaining to battery data to train a pseudo-two-dimensional physics-based model to output the predicted anode potential, wherein the battery data comprises current, temperature, or some combination thereof, and
(ii) training a machine learning model using labeled data comprising the battery data as inputs and the predicted anode potential as outputs.

14. The computer-readable media of any clause herein, wherein modifying the charging policy of the battery pack comprises determining a new anode potential offset to create a more conservative charging policy.

15. The computer-readable media of any clause herein, wherein the one or more processing devices use an edge processor to execute one or more trained machine learning models to predict the anode potential.

16. The computer-readable media of any clause herein, wherein the one or more processing devices use a cloud-based computing system to execute one or more trained machine learning models to predict the anode potential.

17. The computer-readable media of any clause herein, wherein the charging policy comprises values for current, voltage, or both to be used to charge the battery pack.

18. The computer-readable media of any clause herein, wherein the one or more processing devices:
receive, from a cloud-based computing system, one or more parameters pertaining to predicting the anode potential, wherein the one or more parameters are determined based on fleet vehicle historical data pertaining to anode potential of fleet battery packs;
retrain, at an edge processor, one or more machine learning models using the one or more parameters to predict the anode potential for subsequent charging cycles.

19. A system comprising:
one or more memory devices storing instructions; and
one or more processing devices communicatively coupled to the one or more memory devices, the one or more processing devices execute the instructions to:
while a battery pack is charging, predict an anode potential of the battery pack;
determine whether the anode potential satisfies a threshold condition;
responsive to determining that the anode potential satisfies the threshold condition, modify a charging policy of a battery pack to adjust an anode potential offset; and
control, based on the charging policy, charging of the battery pack to adjust the anode potential offset.

20. The system of any clause herein, wherein the anode potential is predicted without using a sensor coupled to the battery pack.

21. The system of any clause herein, wherein the anode potential is predicted using a sensor coupled to the battery pack.

22. The system of any clause herein, wherein predicting the anode potential of the battery pack comprises:
(i) using inputs pertaining to battery data to train a pseudo-two-dimensional physics-based model to output the predicted anode potential, wherein the battery data comprises current, temperature, or some combination thereof, and
(ii) training a machine learning model using labeled data comprising the battery data as inputs and the predicted anode potential as outputs.

23. The system of any clause herein, wherein modifying the charging policy of the battery pack comprises determining a new anode potential offset to create a more conservative charging policy.

24. The system of any clause herein, wherein the one or more processing devices use an edge processor to execute one or more trained machine learning models to predict the anode potential.

25. The system of any clause herein, wherein the one or more processing devices use a cloud-based computing system to execute one or more trained machine learning models to predict the anode potential.

26. The system of any clause herein, wherein the charging policy comprises values for current, voltage, or both to be used to charge the battery pack.

27 The system of any clause herein, wherein the one or more processing devices:
receive, from a cloud-based computing system, one or more parameters pertaining to predicting the anode potential, wherein the one or more parameters are determined based on fleet vehicle historical data pertaining to anode potential of fleet battery packs;
retrain, at an edge processor, one or more machine learning models using the one or more parameters to predict the anode potential for subsequent charging cycles.

28. An apparatus comprising:
one or more memory devices storing instructions; and
one or more processing devices communicatively coupled to the one or more memory devices, the one or more processing devices execute the instructions to:
while a battery pack is charging, predict an anode potential of the battery pack;
determine whether the anode potential satisfies a threshold condition;
responsive to determining that the anode potential satisfies the threshold condition, modify a charging policy of a battery pack to adjust an anode potential offset; and control, based on the charging policy, charging of the battery pack to adjust the anode potential offset.

29. The apparatus of any clause herein, wherein the anode potential is predicted without using a sensor coupled to the battery pack.

30. The apparatus of any clause herein, wherein the anode potential is predicted using a sensor coupled to the battery pack.

31. A computer-implemented method comprising:
receiving, at a cloud-based computing system, historical data comprising (i) battery charging profiles associated with a fleet of vehicles comprising battery packs, (ii) geographical climate information associated with the fleet of vehicles comprising the battery packs, (iii) lithium plating prediction results associated with the fleet of vehicles comprising the battery packs, or (iv) some combination thereof;
training, using the historical data, one or more lithium plating prediction models to predict a likelihood of occurrence of lithium plating for a battery pack;
receiving, from an edge processor communicatively coupled to a battery pack, battery pack charging data;
determining, using the one or more lithium plating prediction models based on the battery pack charging data, the likelihood of occurrence of lithium plating for the battery pack;
based on the likelihood of occurrence of lithium plating for the battery pack, modifying a battery charging policy for the battery pack; and
transmitting the battery charging policy for the battery pack to the edge processor to cause the edge processor to control charging of the battery pack based on the battery charging policy.

32. The computer-implemented method of any clause herein, wherein the battery charging profiles comprise battery pack cell voltages, currents, temperatures, modified anode potential offsets, lithium plating information, or some combination thereof.

33. The computer-implemented method of any clause herein, wherein the battery pack charging data is associated with a battery pack of a vehicle and the likelihood of occurrence of lithium plating for the battery pack is determined in real-time or near real-time to perform a pre-emptive intervention by modifying the battery charging policy for the battery pack.

34. The computer-implemented method of any clause herein, wherein the one or more lithium plating prediction models comprise one or more trained machine learning models.

35. The computer-implemented method of any clause herein, further comprising:
receiving cell tear-down data pertaining to the fleet of vehicles comprising the battery packs; and
retraining, using the cell tear-down data, the one or more lithium plating prediction models to predict the likelihood of occurrence of lithium plating for the battery pack.

36. The computer-implemented method of any clause herein, further comprising receiving, from an edge processor associated with a vehicle comprising the battery pack, a notification that an anode potential offset cannot be adjusted further and the battery pack is a tear-down candidate.

37. The computer-implemented method of any clause herein, further comprising transmitting one or more parameters of the one or more lithium plating prediction models to an edge processor to cause the edge processor to retrain one or more edge machine learning models.

38. The computer-implemented method of any clause herein, wherein the one or more lithium plating prediction models are trained to predict the likelihood of occurrence of lithium plating by predicting an anode potential of the battery pack.

39. The computer-implemented method of any clause herein, wherein modifying the battery charging policy for the battery pack comprises modifying an anode potential offset of the battery pack.

40. One or more tangible, non-transitory computer-readable media storing instructions that, when executed, cause one or more processing devices to:
receive, at a cloud-based computing system, historical data comprising (i) battery charging profiles associated with a fleet of vehicles comprising battery packs, (ii) geographical climate information associated with the fleet of vehicles comprising the battery packs, (iii) lithium plating prediction results associated with the fleet of vehicles comprising the battery packs, or (iv) some combination thereof;
train, using the historical data, one or more lithium plating prediction models to predict a likelihood of occurrence of lithium plating for a battery pack;
receive, from an edge processor communicatively coupled to a battery pack, battery pack charging data;
determine, using the one or more lithium plating prediction models based on the battery pack charging data, the likelihood of occurrence of lithium plating for the battery pack;
based on the likelihood of occurrence of lithium plating for the battery pack, modify a battery charging policy for the battery pack; and
transmit the battery charging policy for the battery pack to the edge processor to cause the edge processor to control charging of the battery pack based on the battery charging policy.

41. The computer-readable media of any clause herein, wherein the battery charging profiles comprise battery pack cell voltages, currents, temperatures, modified anode potential offsets, lithium plating information, or some combination thereof.

42. The computer-readable media of any clause herein, wherein the battery pack charging data is associated with a battery pack of a vehicle and the likelihood of occurrence of lithium plating for the battery pack is determined in real-time or near real-time to perform a pre-emptive intervention by modifying the battery charging policy for the battery pack.

43. The computer-readable media of any clause herein, wherein the one or more lithium plating prediction models comprise one or more trained machine learning models.

44 The computer-readable media of any clause herein, wherein the one or more processing devices:
receive cell tear-down data pertaining to the fleet of vehicles comprising the battery packs; and
retrain, using the cell tear-down data, the one or more lithium plating prediction models to predict the likelihood of occurrence of lithium plating for the battery pack.

45. The computer-readable media of any clause herein, wherein the one or more processing devices receive, from an edge processor associated with a vehicle comprising the battery pack, a notification that an anode potential offset cannot be adjusted further and the battery pack is a tear-down candidate.

46. The computer-readable media of any clause herein, wherein the one or more processing devices transmit one or more parameters of the one or more lithium plating prediction models to an edge processor to cause the edge processor to retrain one or more edge machine learning models.

47. The computer-readable media of any clause herein, wherein the one or more lithium plating prediction models are trained to predict the likelihood of occurrence of lithium plating by predicting an anode potential of the battery pack.

48. The computer-readable media of any clause herein, wherein modifying the battery charging policy for the battery pack comprises modifying an anode potential offset of the battery pack.

49. A system comprising:
one or more memory devices storing instructions; and
one or more processing devices communicatively coupled to the one or more memory devices, the one or more processing devices execute the instructions to:
receive, at a cloud-based computing system, historical data comprising (i) battery charging profiles associated with a fleet of vehicles comprising battery packs, (ii) geographical climate information associated with the fleet of vehicles comprising the battery packs, (iii) lithium plating prediction results associated with the fleet of vehicles comprising the battery packs, or (iv) some combination thereof;
train, using the historical data, one or more lithium plating prediction models to predict a likelihood of occurrence of lithium plating for a battery pack;
receive, from an edge processor communicatively coupled to a battery pack, battery pack charging data;
determine, using the one or more lithium plating prediction models based on the battery pack charging data, the likelihood of occurrence of lithium plating for the battery pack;
based on the likelihood of occurrence of lithium plating for the battery pack, modify a battery charging policy for the battery pack; and
transmit the battery charging policy for the battery pack to the edge processor to cause the edge processor to control charging of the battery pack based on the battery charging policy.

50. The system of any clause herein, wherein the battery charging profiles comprise battery pack cell voltages, currents, temperatures, modified anode potential offsets, lithium plating information, or some combination thereof.

51. The system of any clause herein, wherein the battery pack charging data is associated with a battery pack of a vehicle and the likelihood of occurrence of lithium plating for the battery pack is determined in real-time or near real-time to perform a pre-emptive intervention by modifying the battery charging policy for the battery pack.

52. The system of any clause herein, wherein the one or more processing devices:
receive cell tear-down data pertaining to the fleet of vehicles comprising the battery packs; and
retrain, using the cell tear-down data, the one or more lithium plating prediction models to predict the likelihood of occurrence of lithium plating for the battery pack.

53. The system of any clause herein, wherein the one or more processing devices receive, from an edge processor associated with a vehicle comprising the battery pack, a notification that an anode potential offset cannot be adjusted further and the battery pack is a tear-down candidate.

54. The system of any clause herein, wherein the one or more processing devices transmit one or more parameters of the one or more lithium plating prediction models to an edge processor to cause the edge processor to retrain one or more edge machine learning models.

55. The system of any clause herein, wherein the one or more lithium plating prediction models are trained to predict the likelihood of occurrence of lithium plating by predicting an anode potential of the battery pack.

56. The system of any clause herein, wherein modifying the battery charging policy for the battery pack comprises modifying an anode potential offset of the battery pack.

57. An apparatus:
one or more memory devices storing instructions; and
one or more processing devices communicatively coupled to the one or more memory devices, the one or more processing devices execute the instructions to:
receive, at a cloud-based computing system, historical data comprising (i) battery charging profiles associated with a fleet of vehicles comprising battery packs, (ii) geographical climate information associated with the fleet of vehicles comprising the battery packs, (iii) lithium plating prediction results associated with the fleet of vehicles comprising the battery packs, or (iv) some combination thereof;
train, using the historical data, one or more lithium plating prediction models to predict a likelihood of occurrence of lithium plating for a battery pack;
receive, from an edge processor communicatively coupled to a battery pack, battery pack charging data;
determine, using the one or more lithium plating prediction models based on the battery pack charging data, the likelihood of occurrence of lithium plating for the battery pack;
based on the likelihood of occurrence of lithium plating for the battery pack, modify a battery charging policy for the battery pack; and
transmit the battery charging policy for the battery pack to the edge processor to cause the edge processor to control charging of the battery pack based on the battery charging policy.

58. The apparatus of any clause herein, wherein the battery charging profiles comprise battery pack cell voltages, currents, temperatures, modified anode potential offsets, lithium plating information, or some combination thereof.

59. The apparatus of any clause herein, wherein the battery pack charging data is associated with a battery pack of a vehicle and the likelihood of occurrence of lithium plating for the battery pack is determined in real-time or near real-time to perform a pre-emptive intervention by modifying the battery charging policy for the battery pack.

60. The system of any clause herein, wherein the one or more lithium plating prediction models comprise one or more trained machine learning models.

61. A computer-implemented method comprising:
determining whether an anode potential offset of a battery pack has reached an upper threshold of a target range;
responsive to determining that the anode potential offset of the battery pack has reached the upper threshold of the target range, receiving tear-down data associated with the battery pack;
training, based on the tear-down data associated with the battery pack, one or more cloud prediction models that are trained to predict a likelihood of occurrence of lithium plating associated with battery packs; and
transmitting, to one or more edge processors of one or more fleet vehicles, one or more parameters associated with the one or more trained prediction models to cause the one or more edge processors to train one or more edge prediction models using the one or more edge processors, wherein the one or more edge processors modify a battery charging policy based on a prediction from the one or more edge prediction models.

62. The computer-implemented method of any clause herein, wherein the tear-down data comprises a severity level of lithium plating associated with the battery pack.

63. The computer-implemented method of any clause herein, wherein the anode potential offset is received from an edge processor of a vehicle associated with the battery pack.

64. The computer-implemented method of any clause herein, wherein the one or more cloud prediction models comprise one or more machine learning models.

65. The computer-implemented method of any clause herein, wherein the one more edge prediction models comprise one or more machine learning models.

66. The computer-implemented method of any clause herein, wherein the battery charging policy comprises a value for current, voltage, or both to apply to a battery charger to charge the battery pack.

67. The computer-implemented method of any clause herein, further comprising comparing a severity level of lithium plating included in the tear-down data with one or more predicted likelihoods of occurrences of lithium plating, and based on the comparison, determining whether to retrain the one or more cloud prediction models.

68. The computer-implemented method of any clause herein, further comprising:
receiving battery pack data associated with a vehicle;
predicting, using the one or more cloud prediction models and based on the battery pack data, the likelihood of occurrence of the lithium plating associated with the battery pack; and
based on the prediction, pre-emptively intervening by modifying an anode potential offset of a battery pack associated with the vehicle.

69. One or more tangible, non-transitory computer-readable media storing instructions that, when executed, cause one or more processing devices to:
determine whether an anode potential offset of a battery pack has reached an upper threshold of a target range;
responsive to determining that the anode potential offset of the battery pack has reached the upper threshold of the target range, receive tear-down data associated with the battery pack;
train, based on the tear-down data associated with the battery pack, one or more cloud prediction models that are trained to predict a likelihood of occurrence of lithium plating associated with battery packs; and
transmit, to one or more edge processors of one or more fleet vehicles, one or more parameters associated with the one or more trained prediction models to cause the one or more edge processors to train one or more edge prediction models using the one or more edge processors, wherein the one or more edge processors modify a battery charging policy based on a prediction from the one or more edge prediction models.

70. The computer-readable media of any clause herein, wherein the tear-down data comprises a severity level of lithium plating associated with the battery pack.

71. The computer-readable media of any clause herein, wherein the anode potential offset is received from an edge processor of a vehicle associated with the battery pack.

72. The computer-readable media of any clause herein, wherein the one or more cloud prediction models comprise one or more machine learning models.

73. The computer-readable media of any clause herein, wherein the one more edge prediction models comprise one or more machine learning models.

74. The computer-readable media of any clause herein, wherein the battery charging policy comprises a value for current, voltage, or both to apply to a battery charger to charge the battery pack.

75. The computer-readable media of any clause herein, wherein the one or more processing devices compare a severity level of lithium plating included in the tear-down data with one or more predicted likelihoods of occurrences of lithium plating, and based on the comparison, determining whether to retrain the one or more cloud prediction models.

76. The computer-readable media of any clause herein, wherein the one or more processing devices:
receiving battery pack data associated with a vehicle;
predicting, using the one or more cloud prediction models and based on the battery pack data, the likelihood of occurrence of the lithium plating associated with the battery pack; and
based on the prediction, pre-emptively intervening by modifying an anode potential offset of a battery pack associated with the vehicle.

77. A system comprising:
one or more memory devices storing instructions; and
one or more processing devices communicatively coupled to the one or more memory devices, the one or more processing devices execute the instructions to:
determine whether an anode potential offset of a battery pack has reached an upper threshold of a target range;
responsive to determining that the anode potential offset of the battery pack has reached the upper threshold of the target range, receive tear-down data associated with the battery pack;
train, based on the tear-down data associated with the battery pack, one or more cloud prediction models that are trained to predict a likelihood of occurrence of lithium plating associated with battery packs; and
transmit, to one or more edge processors of one or more fleet vehicles, one or more parameters associated with the one or more trained prediction models to cause the one or more edge processors to train one or more edge prediction models using the one or more edge processors, wherein the one or more edge processors modify a battery charging policy based on a prediction from the one or more edge prediction models.

78. The system of any clause herein, wherein the tear-down data comprises a severity level of lithium plating associated with the battery pack.

79. The system of any clause herein, wherein the anode potential offset is received from an edge processor of a vehicle associated with the battery pack.

80. The system of any clause herein, wherein the one or more cloud prediction models comprise one or more machine learning models.

81. The system of any clause herein, wherein the one more edge prediction models comprise one or more machine learning models.

82. The system of any clause herein, wherein the battery charging policy comprises a value for current, voltage, or both to apply to a battery charger to charge the battery pack.

83. The system of any clause herein, wherein the one or more processing devices compare a severity level of lithium plating included in the tear-down data with one or more predicted likelihoods of occurrences of lithium plating, and based on the comparison, determining whether to retrain the one or more cloud prediction models.

84. The computer-readable media of any clause herein, wherein the one or more processing devices:
receive battery pack data associated with a vehicle;
predict, using the one or more cloud prediction models and based on the battery pack data, the likelihood of occurrence of the lithium plating associated with the battery pack; and
based on the prediction, pre-emptively intervene by modifying an anode potential offset of a battery pack associated with the vehicle.

85. An apparatus comprising:
one or more memory devices storing instructions; and
one or more processing devices communicatively coupled to the one or more memory devices, the one or more processing devices execute the instructions to:
determine whether an anode potential offset of a battery pack has reached an upper threshold of a target range;
responsive to determining that the anode potential offset of the battery pack has reached the upper threshold of the target range, receive tear-down data associated with the battery pack;
train, based on the tear-down data associated with the battery pack, one or more cloud prediction models that are trained to predict a likelihood of occurrence of lithium plating associated with battery packs; and
transmit, to one or more edge processors of one or more fleet vehicles, one or more parameters associated with the one or more trained prediction models to cause the one or more edge processors to train one or more edge prediction models using the one or more edge processors, wherein the one or more edge processors modify a battery charging policy based on a prediction from the one or more edge prediction models.

86. The apparatus of any clause herein, wherein the tear-down data comprises a severity level of lithium plating associated with the battery pack.

87. The apparatus of any clause herein, wherein the anode potential offset is received from an edge processor of a vehicle associated with the battery pack.

88. The apparatus of any clause herein, wherein the one or more cloud prediction models comprise one or more machine learning models.

89. The apparatus of any clause herein, wherein the one more edge prediction models comprise one or more machine learning models.

90. The apparatus of any clause herein, wherein the battery charging policy comprises a value for current, voltage, or both to apply to a battery charger to charge the battery pack.

91. A computer-implemented method comprising:
detecting, using one or more monitoring models, a first likelihood of occurrence of lithium plating associated with a portion of a battery pack that is charging;
transmitting, to a cloud-based computing system, information comprising (i) the first likelihood of occurrence of lithium plating and (ii) a profile associated with the battery pack, wherein:
the cloud-based computing system retrains one or more prediction models based on the information and second information associated with a fleet of battery packs,
the one or more prediction models predict a second likelihood of occurrence of the lithium plating associated with the portion of the battery pack that is charging, and,
based on the second likelihood of occurrence of the lithium plating, the cloud-based computing system generates a modified charging policy for the battery pack;
receiving, from the cloud-based computing system, the modified charging policy for the battery pack; and
controlling, based on the modified charging policy for the battery pack, charging of the battery pack.

92. The computer-implemented method of claim 91, wherein the modified charging policy comprises a specified value for a current, voltage, or both.

93. The computer-implemented method of claim 91, wherein the modified charging policy modifies an anode potential offset of the battery pack.

94. The computer-implemented method of claim 91, further comprising:
determining whether an anode potential offset of the portion of the battery pack has reached a certain threshold;
responsive to determining that the anode potential offset of the portion of the battery pack has reached the certain threshold, transmitting a notification to the cloud-based computing system indicating the battery pack is a tear-down candidate, wherein the notification comprises battery pack data pertaining to the battery pack.

95. The computer-implemented method of claim 94, wherein the notification causes the cloud-based computing system to retrain the one or more prediction models using the battery pack data.

96. The computer-implemented method of claim 91, wherein the one or more monitoring models comprise one or more machine learning models.

97. The computer-implemented method of claim 91, wherein the one or more prediction models comprise one or more machine learning models.

98 The computer-implemented method of claim 91, wherein the first likelihood of occurrence of lithium plating is detected based on a predicted anode potential of the battery pack.

99. One or more tangible, non-transitory computer-readable media storing instructions that, when executed, cause one or more processing devices to:
detect, using one or more monitoring models, a first likelihood of occurrence of lithium plating associated with a portion of a battery pack that is charging;
transmit, to a cloud-based computing system, information comprising (i) the first likelihood of occurrence of lithium plating and (ii) a profile associated with the battery pack, wherein:
the cloud-based computing system retrains one or more prediction models based on the information and second information associated with a fleet of battery packs,
the one or more prediction models predict a second likelihood of occurrence of the lithium plating associated with the portion of the battery pack that is charging, and,
based on the second likelihood of occurrence of the lithium plating, the cloud-based computing system generates a modified charging policy for the battery pack;
receive, from the cloud-based computing system, the modified charging policy for the battery pack; and control, based on the modified charging policy for the battery pack, charging of the battery pack.

100. The computer-readable media of any clause herein, wherein the modified charging policy comprises a specified value for a current, voltage, or both.

101. The computer-readable media of any clause herein, wherein the modified charging policy modifies an anode potential offset of the battery pack.

102. The computer-readable media of any clause herein, wherein the one or more processing devices:
determine whether an anode potential offset of the portion of the battery pack has reached a certain threshold;
responsive to determining that the anode potential offset of the portion of the battery pack has reached the certain threshold, transmit a notification to the cloud-based computing system indicating the battery pack is a tear-down candidate, wherein the notification comprises battery pack data pertaining to the battery pack.

103. The computer-readable media of any clause herein, wherein the notification causes the cloud-based computing system to retrain the one or more prediction models using the battery pack data.

104. The computer-readable media of any clause herein, wherein the one or more monitoring models comprise one or more machine learning models.

105. The computer-readable media of any clause herein, wherein the one or more prediction models comprise one or more machine learning models.

106. The computer-readable media of any clause herein, wherein the first likelihood of occurrence of lithium plating is detected based on a predicted anode potential of the battery pack.

107. A system comprising:
one or more memory devices storing instructions; and
one or more processing devices communicatively coupled to the one or more memory devices, the one or more processing devices execute the instructions to:
detect, using one or more monitoring models, a first likelihood of occurrence of lithium plating associated with a portion of a battery pack that is charging;
transmit, to a cloud-based computing system, information comprising (i) the first likelihood of occurrence of lithium plating and (ii) a profile associated with the battery pack, wherein:
the cloud-based computing system retrains one or more prediction models based on the information and second information associated with a fleet of battery packs,
the one or more prediction models predict a second likelihood of occurrence of the lithium plating associated with the portion of the battery pack that is charging, and,
based on the second likelihood of occurrence of the lithium plating, the cloud-based computing system generates a modified charging policy for the battery pack;
receive, from the cloud-based computing system, the modified charging policy for the battery pack; and
control, based on the modified charging policy for the battery pack, charging of the battery pack.

108. The system of any clause herein, wherein the modified charging policy comprises a specified value for a current, voltage, or both.

109. The system of any clause herein, wherein the modified charging policy modifies an anode potential offset of the battery pack.

110. The system of any clause herein, wherein the one or more processing devices:
determine whether an anode potential offset of the portion of the battery pack has reached a certain threshold;
responsive to determining that the anode potential offset of the portion of the battery pack has reached the certain threshold, transmit a notification to the cloud-based computing system indicating the battery pack is a tear-down candidate, wherein the notification comprises battery pack data pertaining to the battery pack.

111. The system of any clause herein, wherein the notification causes the cloud-based computing system to retrain the one or more prediction models using the battery pack data.

112. The system of any clause herein, wherein the one or more monitoring models comprise one or more machine learning models.

113. The system of any clause herein, wherein the one or more prediction models comprise one or more machine learning models.

114. The system of any clause herein, wherein the first likelihood of occurrence of lithium plating is detected based on a predicted anode potential of the battery pack.

115. An apparatus comprising:
one or more memory devices storing instructions; and
one or more processing devices communicatively coupled to the one or more memory devices, the one or more processing devices execute the instructions to:
detect, using one or more monitoring models, a first likelihood of occurrence of lithium plating associated with a portion of a battery pack that is charging;
transmit, to a cloud-based computing system, information comprising (i) the first likelihood of occurrence of lithium plating and (ii) a profile associated with the battery pack, wherein:
the cloud-based computing system retrains one or more prediction models based on the information and second information associated with a fleet of battery packs,
the one or more prediction models predict a second likelihood of occurrence of the lithium plating associated with the portion of the battery pack that is charging, and,
based on the second likelihood of occurrence of the lithium plating, the cloud-based computing system generates a modified charging policy for the battery pack;
receive, from the cloud-based computing system, the modified charging policy for the battery pack; and
control, based on the modified charging policy for the battery pack, charging of the battery pack.

116. The apparatus of any clause herein, wherein the modified charging policy comprises a specified value for a current, voltage, or both.

117. The apparatus of any clause herein, wherein the modified charging policy modifies an anode potential offset of the battery pack.

118. The apparatus of any clause herein, wherein the one or more processing devices:
determine whether an anode potential offset of the portion of the battery pack has reached a certain threshold;
responsive to determining that the anode potential offset of the portion of the battery pack has reached the certain threshold, transmit a notification to the cloud-based computing system indicating the battery pack is a tear-down candidate, wherein the notification comprises battery pack data pertaining to the battery pack.

119. The apparatus of any clause herein, wherein the notification causes the cloud-based computing system to retrain the one or more prediction models using the battery pack data.

120. The apparatus of any clause herein, wherein the one or more monitoring models comprise one or more machine learning models.

What is claimed is:

1. A computer-implemented method comprising:
   determining, using one or more trained machine learning models, a first likelihood of occurrence of lithium plating of a battery pack;
   comparing the first likelihood of occurrence of lithium plating with tear-down data comprising severity levels of actual occurrences of lithium plating of a fleet of battery packs;
   based on the comparison, determining whether there is a threshold difference between the first likelihood of occurrence of lithium plating and the tear-down data;
   responsive to determining that there is the threshold difference between the first likelihood of occurrence of lithium plating and the tear-down data, retraining the one or more trained machine learning models with the tear-down data comprising the severity levels of actual occurrences of lithium plating of the fleet of battery packs;
   determining, using the one or more retrained machine learning models, a second likelihood of occurrence of lithium plating of the battery pack;
   based on the second likelihood of occurrence, predicting an anode potential of the battery pack;
   determining whether the anode potential satisfies a threshold condition;
   responsive to determining that the anode potential satisfies the threshold condition, modifying a charging policy of the battery pack to adjust an anode potential offset; and
   controlling, based on the charging policy, charging of the battery pack to adjust the anode potential offset.

2. The computer-implemented method of claim 1, wherein the anode potential is predicted without using a sensor coupled to the battery pack.

3. The computer-implemented method of claim 1, wherein the anode potential is predicted using a sensor coupled to the battery pack.

4. The computer-implemented method of claim 1, wherein predicting the anode potential of the battery pack comprises:
   (i) using inputs pertaining to battery data to train a pseudo-two-dimensional physics-based model to output the predicted anode potential, wherein the battery data comprises current, temperature, or some combination thereof, and
   (ii) training a machine learning model using labeled data comprising the battery data as inputs and the predicted anode potential as outputs.

5. The computer-implemented method of claim 1, wherein modifying the charging policy of the battery pack comprises determining a new anode potential offset to create a more conservative charging policy.

6. The computer-implemented method of claim 1, further comprising using an edge processor to execute one or more trained machine learning models to predict the anode potential.

7. The computer-implemented method of claim 1, further comprising using a cloud-based computing system to execute one or more trained machine learning models to predict the anode potential.

8. The computer-implemented method of claim 1, wherein the charging policy comprises values for current, voltage, or both to be used to charge the battery pack.

9. The computer-implemented method of claim 1, further comprising:
   receiving, from a cloud-based computing system, one or more parameters pertaining to predicting the anode potential, wherein the one or more parameters are determined based on fleet vehicle historical data pertaining to anode potential of fleet battery packs;
   retraining, at an edge processor, one or more machine learning models using the one or more parameters to predict the anode potential for subsequent charging cycles.

10. One or more tangible, non-transitory computer-readable media storing instructions that, when executed, cause one or more processing devices to:
   determine, using one or more trained machine learning models, a first likelihood of occurrence of lithium plating of a battery pack;
   compare the first likelihood of occurrence of lithium plating with tear-down data comprising severity levels of actual occurrences of lithium plating of a fleet of battery packs;
   based on the comparison, determine whether there is a threshold difference between the first likelihood of occurrence of lithium plating and the tear-down data;
   responsive to determining that there is the threshold difference between the first likelihood of occurrence of lithium plating and the tear-down data, retrain the one or more trained machine learning models with the tear-down data comprising the severity levels of actual occurrences of lithium plating of the fleet of battery packs;
   determine, using the one or more retrained machine learning models, a second likelihood of occurrence of lithium plating of the battery pack;
   based on the second likelihood of occurrence, predict an anode potential of the battery pack;
   determine whether the anode potential satisfies a threshold condition;
   responsive to determining that the anode potential satisfies the threshold condition, modify a charging policy of the battery pack to adjust an anode potential offset; and
   control, based on the charging policy, charging of the battery pack to adjust the anode potential offset.

11. The computer-readable media of claim 10, wherein the anode potential is predicted without using a sensor coupled to the battery pack.

12. The computer-readable media of claim 10, wherein the anode potential is predicted using a sensor coupled to the battery pack.

13. The computer-readable media of claim 10, wherein predicting the anode potential of the battery pack comprises:
   (i) using inputs pertaining to battery data to train a pseudo-two-dimensional physics-based model to output the predicted anode potential, wherein the battery data comprises current, temperature, or some combination thereof, and
   (ii) training a machine learning model using labeled data comprising the battery data as inputs and the predicted anode potential as outputs.

14. The computer-readable media of claim 10, wherein modifying the charging policy of the battery pack comprises determining a new anode potential offset to create a more conservative charging policy.

15. The computer-readable media of claim 10, wherein the one or more processing devices use an edge processor to execute one or more trained machine learning models to predict the anode potential.

16. The computer-readable media of claim 10, wherein the one or more processing devices use a cloud-based computing system to execute one or more trained machine learning models to predict the anode potential.

17. The computer-readable media of claim 10, wherein the charging policy comprises values for current, voltage, or both to be used to charge the battery pack.

18. The computer-readable media of claim 10, wherein the one or more processing devices:
receive, from a cloud-based computing system, one or more parameters pertaining to predicting the anode potential, wherein the one or more parameters are determined based on fleet vehicle historical data pertaining to anode potential of fleet battery packs;
retrain, at an edge processor, one or more machine learning models using the one or more parameters to predict the anode potential for subsequent charging cycles.

19. A system comprising:
one or more memory devices storing instructions; and
one or more processing devices communicatively coupled to the one or more memory devices, the one or more processing devices execute the instructions to:
determine, using one or more trained machine learning models, a first likelihood of occurrence of lithium plating of a battery pack;
compare the first likelihood of occurrence of lithium plating with tear-down data comprising severity levels of actual occurrences of lithium plating of a fleet of battery packs;
based on the comparison, determine whether there is a threshold difference between the first likelihood of occurrence of lithium plating and the tear-down data;
responsive to determining that there is the threshold difference between the first likelihood of occurrence of lithium plating and the tear-down data, retrain the one or more trained machine learning models with the tear-down data comprising the severity levels of actual occurrences of lithium plating of the fleet of battery packs;
determine, using the one or more retrained machine learning models, a second likelihood of occurrence of lithium plating of the battery pack;
based on the second likelihood of occurrence, predict an anode potential of the battery pack;
determine whether the anode potential satisfies a threshold condition;
responsive to determining that the anode potential satisfies the threshold condition, modify a charging policy of the battery pack to adjust an anode potential offset; and
control, based on the charging policy, charging of the battery pack to adjust the anode potential offset.

20. The system of claim 19, wherein the anode potential is predicted without using a sensor coupled to the battery pack.

21. The system of claim 19, wherein the anode potential is predicted using a sensor coupled to the battery pack.

22. The system of claim 19, wherein predicting the anode potential of the battery pack comprises:

(i) using inputs pertaining to battery data to train a pseudo-two-dimensional physics-based model to output the predicted anode potential, wherein the battery data comprises current, temperature, or some combination thereof, and
(ii) training a machine learning model using labeled data comprising the battery data as inputs and the predicted anode potential as outputs.

23. The system of claim 19, wherein modifying the charging policy of the battery pack comprises determining a new anode potential offset to create a more conservative charging policy.

24. The system of claim 19, wherein the one or more processing devices use an edge processor to execute one or more trained machine learning models to predict the anode potential.

25. The system of claim 19, wherein the one or more processing devices use a cloud-based computing system to execute one or more trained machine learning models to predict the anode potential.

26. The system of claim 19, wherein the charging policy comprises values for current, voltage, or both to be used to charge the battery pack.

27. The system of claim 19, wherein the one or more processing devices:
receive, from a cloud-based computing system, one or more parameters pertaining to predicting the anode potential, wherein the one or more parameters are determined based on fleet vehicle historical data pertaining to anode potential of fleet battery packs;
retrain, at an edge processor, one or more machine learning models using the one or more parameters to predict the anode potential for subsequent charging cycles.

28. An apparatus comprising:
one or more memory devices storing instructions; and
one or more processing devices communicatively coupled to the one or more memory devices, the one or more processing devices execute the instructions to:
determine, using one or more trained machine learning models, a first likelihood of occurrence of lithium plating of a battery pack;
compare the first likelihood of occurrence of lithium plating with tear-down data comprising severity levels of actual occurrences of lithium plating of a fleet of battery packs;
based on the comparison, determine whether there is a threshold difference between the first likelihood of occurrence of lithium plating and the tear-down data;
responsive to determining that there is the threshold difference between the first likelihood of occurrence of lithium plating and the tear-down data, retrain the one or more trained machine learning models with the tear-down data comprising the severity levels of actual occurrences of lithium plating of the fleet of battery packs;
determine, using the one or more retrained machine learning models, a second likelihood of occurrence of lithium plating of the battery pack;
based on the second likelihood of occurrence, predict an anode potential of the battery pack;
determine whether the anode potential satisfies a threshold condition;
responsive to determining that the anode potential satisfies the threshold condition, modify a charging policy of the battery pack to adjust an anode potential offset; and control, based on the charging policy, charging of the battery pack to adjust the anode potential offset.

29. The apparatus of claim 28, wherein the anode potential is predicted without using a sensor coupled to the battery pack.

30. The apparatus of claim 28, wherein the anode potential is predicted using a sensor coupled to the battery pack.

\* \* \* \* \*